US006674282B2

(12) United States Patent
Pines et al.

(10) Patent No.: US 6,674,282 B2
(45) Date of Patent: Jan. 6, 2004

(54) METHOD AND APPARATUS FOR HIGH RESOLUTION EX-SITU NMR SPECTROSCOPY

(75) Inventors: Alexander Pines, Berkeley, CA (US); Carlos A. Meriles, El Cerrito, CA (US); Henrike Heise, Goettingen (DE); Dimitrios Sakellariou, Oakland, CA (US); Adam Moule, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/218,974

(22) Filed: Aug. 13, 2002

(65) Prior Publication Data

US 2003/0052677 A1 Mar. 20, 2003

Related U.S. Application Data

(63) Continuation-in-part of application No. PCT/US02/11049, filed on Apr. 9, 2002.
(60) Provisional application No. 60/312,447, filed on Aug. 14, 2001, provisional application No. 60/296,140, filed on Jun. 5, 2001, provisional application No. 60/282,706, filed on Apr. 9, 2001, and provisional application No. 60/282,681, filed on Apr. 9, 2001.

(51) Int. Cl.[7] .................................................. G01V 3/00
(52) U.S. Cl. ........................................ 324/307; 324/309
(58) Field of Search ................................ 327/307, 309, 327/315, 310, 311, 318, 322; 128/653.2, 653.5

(56) References Cited

U.S. PATENT DOCUMENTS

| 5,229,722 A | * | 7/1993 | Rommel et al. ............ 324/307 |
| 5,393,717 A | * | 2/1995 | Apelian et al. ............... 502/52 |
| 5,712,146 A | * | 1/1998 | Khosla et al. ......... 435/252.35 |
| 5,935,065 A | | 8/1999 | Rose, Jr. et al. ............ 600/421 |
| 6,100,688 A | | 8/2000 | Smith et al. ................. 324/300 |
| 6,133,735 A | | 10/2000 | Hurlimann et al. ......... 324/307 |

OTHER PUBLICATIONS

Bifone, A. et al.; "NMR of Lasser–Polarized Xenon in Human Blood," Proc. Natl. Acad. Sci., vol. 93, pp. 12932–12936, Nov. 1996.

Augustine, Matthew P. et al.; "Low Field Magnetic Resonance Images of Polarized Noble Gases Obtained with a DC Superconducting Quantum Interference Device," Applied Physics Letters, vol. 72, No. 15, pp. 1908–1910, Apr. 13, 1998.

(List continued on next page.)

Primary Examiner—Diego Gutierrez
Assistant Examiner—Brij B. Shrivastav
(74) Attorney, Agent, or Firm—John P. O'Banion

(57) ABSTRACT

A method and apparatus for ex-situ nuclear magnetic resonance spectroscopy for use on samples outside the physical limits of the magnets in inhomogeneous static and radio-frequency fields. Chemical shift spectra can be resolved with the method using sequences of correlated, composite z-rotation pulses in the presence of spatially matched static and radio frequency field gradients producing nutation echoes. The amplitude of the echoes is modulated by the chemical shift interaction and an inhomogeneity free FID may be recovered by stroboscopically sampling the maxima of the echoes. In an alternative embodiment, full-passage adiabatic pulses are consecutively applied. One embodiment of the apparatus generates a static magnetic field that has a variable saddle point.

44 Claims, 19 Drawing Sheets

OTHER PUBLICATIONS

Song, Yi–Qiao et al.; "NMR and MRI Using Laser–Polarized Xenon," Spectroscopy, vol. 14, No. 7, Cover page, pp. 26 thru 33, Jul. 1999.

Brill, Thilo M. et al.; "Non–Resonant Multiple Spin–Echoes," Schlumberger–Doll Research, 36 Old Quarry Road, Ridgefield, CT 06877, pp. 1 thru 11, (brill2@slb.com), (2001).

Meriles, Carlos A. et al.; "Approach to High–Resolution Ex Situ NMR Spectroscopy," Science, vol. 293, pp. 82–85, Jul. 6, 2001.

Ardelean, Ioan et al.; "The Nutation Spin Echo and Its Use for Locatlized NRM," Journal of Magnetic Resonance, vol. 146, pp. 43–48, (2000).

Kleinberg, R.L. et al.; "Novel NMR Apparatus for Investigating an External Sample," Journal of Magnetic Resonance, vol. 97, pp. 466–485, (1992).

Balbach, John J. et al.; "High–Resolution NMR in Inhomogeneous Fields," Chemical Physics Letters, vol. 277, pp. 367–374, (1997).

* cited by examiner

METHOD AND APPARATUS FOR HIGH RESOLUTION EX-SITU NMR SPECTROSCOPY

CROSS-REFERENCE TO RELATED APPLICATIONS

This application claims priority from, and is a 35 U.S.C. §111(a) continuation-in-part of, co-pending PCT international application serial number PCT/US02/11049 filed on Apr. 9, 2002 which designates the U.S., which in turn claims priority from U.S. provisional application serial No. 60/312,447 filed on Aug. 14, 2001 and incorporated herein by reference, U.S. provisional application serial No. 60/296,140 filed on Jun. 5, 2001 and incorporated herein by reference, U.S. provisional application serial No. 60/282,706 filed on Apr. 9, 2001 and incorporated herein by reference, and U.S. provisional application serial No. 60/282,681 filed on Apr. 9, 2001 and incorporated herein by reference.

REFERENCE TO A COMPUTER PROGRAM APPENDIX

Not Applicable

STATEMENT REGARDING FEDERALLY SPONSORED RESEARCH OR DEVELOPMENT

This invention was made with Government support under Contract No. DE-AC03-76SF00098, awarded by the Department of Energy. The Government has certain rights in this invention.

BACKGROUND OF THE INVENTION

1. Field of the Invention

The present invention pertains generally to high-resolution molecular spectroscopy and imaging devices and methods, and more particularly to an apparatus and method for ex-situ NMR spectroscopy and imaging.

2. Description of the Background Art

Nuclear magnetic resonance spectroscopy is a sensitive tool for studying the physical, chemical and biological properties of matter at a molecular level. One-dimensional and two-dimensional NMR imaging techniques are routinely used by chemists to determine the structure of simple and complicated molecules and such techniques are replacing traditional x-ray crystallography as the preferred method for determining smaller protein structures of 25 kDa or less.

The phenomenon called nuclear magnetic resonance (NMR) occurs when the nuclei of certain atoms are placed in a static magnetic field. The nuclei of the atoms of elements with an odd atomic number possess spin (l) and have a nuclear magnetic moment. As the positively charged nucleus spins, the moving charge creates a magnetic moment.

When no external magnetic field is applied, the magnetic moments of nuclei are aligned randomly. However, if the nuclei are placed in an external homogeneous magnetic field ($B_0$), the magnetic moments will either align with the external magnetic field or in opposition to the magnetic field. The alignment of the groups according to one of the two possible orientations follows Boltzmann's statistics and results in a population imbalance among the different energy levels and a net nuclear magnetization M. Accordingly, there will be slightly more nuclei at the lower energy level than at the higher energy level.

Because nuclei behave like magnets, the nuclei have a lower energy state when aligned with the applied magnetic field than when the nuclei are opposed to the magnetic field. In an applied magnetic field, the axis of rotation will precess around the magnetic field. A nucleus in the low energy state may transition to a high-energy state by the absorption of a photon that has an energy that is exactly equal to the energy difference between the two energy states. The energy of a photon is related to its frequency by Plank's constant. The frequency of the photon and the equivalent frequency of precession are referred to as the resonance or Larmor frequency.

Thus, it is possible to make magnetic dipoles "flip" from the low energy, more stable alignment to the high energy, less stable alignment by supplying the right amount of energy. The energy necessary to make this transition depends on the strength of the external magnetic field used and is usually in the range of energies found in radio waves. Therefore, the nuclei can absorb and reemit energy at characteristic radiofrequencies (rf). Furthermore, energy will be absorbed by the same nuclear species at slightly different frequencies depending on the molecular environment of the nucleus of a particular atom.

The precise resonant frequency of the nuclear species is dependent on the magnetic field at the nucleus that will vary depending on the types of nuclei and the bonds in the molecule involving the nuclei. This characteristic variance in the resonance frequency depending on the chemical environment of the nucleus is called the chemical shift ($\delta$) and can be used to deduce the patterns of atomic bonding in the molecule. Chemical shift is the frequency difference between the observed resonance and a resonance from a standard compound and is usually reported in parts per million (ppm) of the mean resonance frequency.

In the typical NMR experiment, the sample is placed in a homogeneous static external magnetic field ($B_0$). By convention, $B_0$ and the net magnetization vector ($M_z$) reside on the z-axis at equilibrium. Also by convention, a rotating frame of reference rotating around the z-axis at the Larmor frequency allows $B_0$ and net nuclear magnetization M to appear static i.e. the x' and y' axes rotate about the z-axis.

Accordingly, the applied radio frequency (rf) pulse has a stationary field vector in the xy plane within this reference frame with a direction governed by the phase of the radio frequency. The application of an rf pulse along the x-axis rotates the nuclear magnetization vector towards the y-axis at an angle that is proportional to the duration and intensity of the rf pulse. A pulse that is of sufficient duration and intensity to rotate the magnetization vector clockwise 90 degrees about the x-axis is termed a 90° or $\pi/2$-pulse. Similarly, a 180° pulse will rotate the magnetization vector 180 degrees and is called a $\pi$ pulse.

Predictably, the populations of nuclei relax to equilibrium at an exponential rate after the termination of the pulse. Once the magnetization vector is placed onto the y-axis, it rotates in the xy plane at a resonant frequency ultimately decaying back to the z-axis emitting rf radiation over time. This is typically the point of data acquisition (Acq.). A receiver coil resonant at the Larmor frequency, generally located along the x-axis, can detect this rotation called the free induction decay (FID). Fourier transformation of the FID provides the NMR spectrum.

One time constant used to describe this return to equilibrium is called the longitudinal or spin lattice relaxation time ($T_1$). The time ($T_1$) will vary as a function of the magnetic field strength. A second time constant, known as the spin-spin relaxation time ($T_2$), which is due to the exchange of energy between spins, is a description of the return to equilibrium of the transverse magnetization ($M_{xy}$) and is always equal to or less than $T_1$.

A spin-echo pulse sequence is normally required to measure $T_2$. The typical pulse-sequence consists of the application of a 90° pulse, which results in the rotation of the magnetization to the xy plane, followed by a 180° pulse that allows the magnetization to partially rephase producing a non-dephased signal called an echo.

Correlation Spectroscopy (COSY) is a useful technique for determining the signals that may arise from nuclei coupled by a coupling interaction such as a scalar J coupling or a dipole coupling as well as nuclei in close proximity to one another. COSY pulse sequences usually include two 90° pulses in succession and gives a signal that varies depending on the time between the application of the two pulses.

Nuclear Overhauser Effect Spectroscopy (NOESY) and Rotational Nuclear Overhauser Effect Spectroscopy (ROESY) have pulse sequences that are used to determine the signal produced from nuclei that are not connected by chemical bonds but are closely oriented in space in the subject molecule.

In general, the practice of high-resolution nuclear magnetic resonance (NMR) spectroscopy yields information about molecular structure and dynamics through the observation of interactions such as chemical shifts and scalar, dipole, quadrupole couplings and the like. These features make in-situ NMR a powerful analytical tool used to study such diverse questions as the metabolism of plants and organisms, the dynamics of geological processes and the characterization of technologically important new materials.

However, there are many circumstances in which it is impractical or undesirable to insert objects or subjects into the bore of a high-field magnet. For many applications it would be useful if a mobile magnet could be scanned over an otherwise inaccessible object or subject in order to acquire magnetic resonance information. The advantage of such ex-situ analysis is that limitations of sample size and transportability no longer prevail. The analysis and imaging of samples that are located outside of the bore of a homogeneous magnet presents serious limitations arising from the presence of strong radio frequency and static field inhomogeneities. As a consequence, the NMR spectra become broadened to the extent that resolution and associated chemical shift information are hidden eliminating the usefulness of ex-situ analysis. The applicability of external detection is limited not only by intrinsic inhomogeneities, but also by the inability to physically rotate many of the samples. Consequently, the use of NMR line narrowing techniques known in the art such as Magic Angle Spinning (MAS), magic angle hopping, dynamic angle spinning or magic angle turning or the like is limited.

Accordingly, a need exists for an ex-situ NMR apparatus and method that can provide chemical shift data from a sample in an inhomogeneous magnetic and rf fields. The present invention satisfies those needs, as well as others, and generally overcomes the deficiencies found in the background art.

BRIEF SUMMARY OF THE INVENTION

The present invention provides an apparatus and methods for NMR spectroscopy and imaging of external samples by refocusing inhomogeneities through the use of correlated, composite z-rotation pulses, producing resolved NMR spectra of liquid and solid samples. By way of example, and not of limitation, in accordance with one aspect of the invention, the observation of chemical shifts is regained through the use of multiple-pulse sequences of trains of composite z-rotation pulses inducing nutation echoes over a region of matched rf and static field gradients.

In one embodiment, the pulse series $(\pi/2)_{-y}(\beta(\vec{r}))_x(\pi/2)_y$ with the constant rotation composite $\pi/2$-pulses tipping the spins back and forth between the xy and yz planes make a position-dependent phase correction possible. In the region of the sample where the static and rf field gradients are matched, a $(\beta(\vec{r}))_x$ pulse applied over the proper time period gives rise to an overall phase shift that exactly reverses the relative positions of (chemically equivalent) fast and slow spins and induces a subsequent nutation echo. Because the same phase shift equally affects nuclei with different chemical shifts, the echo amplitude fully preserves the accumulated phase differences between chemically inequivalent spins. The initial dephasing induced by the pulse $(\beta(\vec{r}))_x$ is refocused during the free evolution (or dwell time) period. A one-point acquisition takes place at the nutation echo maximum, just before the next $(\pi/2)$ pulse.

At each step in the pulse train in this embodiment, a phase alternation is performed in order to compensate for undesired evolution during the rf irradiation. The entire rf sequence is repeated, with stroboscopic detection providing the inhomogeneity-free free induction decay. The constant phase shift $\omega_1{}^0\tau_\beta$ remaining at each step of the train can be corrected by sequentially adjusting the phase of the rf pulses or by a shift of the reference frequency in the measured spectrum following data processing.

In another embodiment, the static field ($B_0$) gradient and the rf field ($B_1$) gradient are matched along the sample (x) by a composite $\beta'$ pulse sequence that functionally depends from the nutation amplitude $\omega_1$. By matching the shapes of the rf and static field inhomogeneities, an echo is induced that preserves the chemical shift information. The fact that the obtained resolution is high enough to observe the chemical shift is in most cases synonymous with high resolution NMR and allows the observation of other interactions such as scalar J couplings, dipolar couplings and quadrupolar couplings, which usually require less stringent high-resolution conditions.

In another embodiment, full passage adiabatic pulses are consecutively applied.

In an alternative embodiment, a probe head having magnets creating a characteristic saddle point in the field and with at least one switchable coil is provided. The sample is placed one side of the saddle point with the coils switched off. One preferred pulse sequence begins with an excitation pulse followed by a short period of evolution. The coils are then switched on so that the saddle point is displaced, and the sample lies now on the other side of the saddle point where the field has a complimentary profile (as a simple example: the gradient has an opposite sign). If necessary, the rf frequency can be shifted so that the spins of the sample continue to resonate. A data point acquisition is made after a gradient cycle.

An object of the invention is to provide an apparatus and method for high-resolution ex-situ NMR spectroscopy.

Another object of the invention is to provide a method of observing chemical shift information in an inhomogeneous magnetic field with a pulse sequence of correlated, composite z-rotation pulses that produce resolved NMR spectra of liquid samples.

Another object of the invention is to provide a sequence of radio frequency pulses that have matched radio frequency and static field inhomogeneities to produce an echo that preserves the chemical shift information.

Another object of the invention is to provide a plurality of composite pulses that are configured so that the static field and rf profiles are matched.

Another object of the invention is to provide a NMR probe that has a plurality of permanent magnets to produce a static magnetic field that exhibits a saddle point and a plurality of coils to permit a variable saddle point.

Yet another object of the invention is provide a pulse sequence comprising multiple adiabatic passages.

Another object of the invention is to provide a method for reducing in-situ residual NMR line width due to static field inhomogeneities.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings, which are for illustrative purposes only.

DETAILED DESCRIPTION OF THE INVENTION

Referring more specifically to the drawings, for illustrative purposes the present invention is embodied in the apparatus and methods generally shown in FIG. 1 through FIG. 11D. It will be appreciated that the apparatus may vary as to configuration and as to details of the components, and that the method may vary as to the specific steps and sequence, without departing from the basic concepts as disclosed herein.

The present invention concerns a method of overcoming the presence of strong radio frequency and static field inhomogeneities that are located outside or inside the bore of a homogeneous magnet by using static and excitation field gradients at different points in the sample to refocus the inhomogeneities thereby allowing the undistorted analysis of the free induction decay (FID) of the ex-situ sample. Additionally, the capability of recording undistorted free induction decay from an ex-situ sample allows the extension of the present methods to multidimensional NMR spectroscopy.

The method generally includes an adaptation of nutation echoes, preferably in the presence of matched inhomogeneous static and radio frequency fields to provide spectra. Chemical shift information is regained through the use of sequences of multiple correlated, composite z-rotation pulses to resolve the NMR spectra.

The present invention may be more particularly described in the following examples that are intended for illustrative purposes only, since numerous modifications, adaptations and variations will be apparent to those skilled in the art.

EXAMPLE 1

Spectroscopic imaging of a sample 12 of trans-2-pentenal under conventional NMR conditions was compared with that of a sample placed outside of the bore of the magnet and then subjected to sequences of correlated z-rotation pulses to resolve the NMR spectra.

Figure 1:
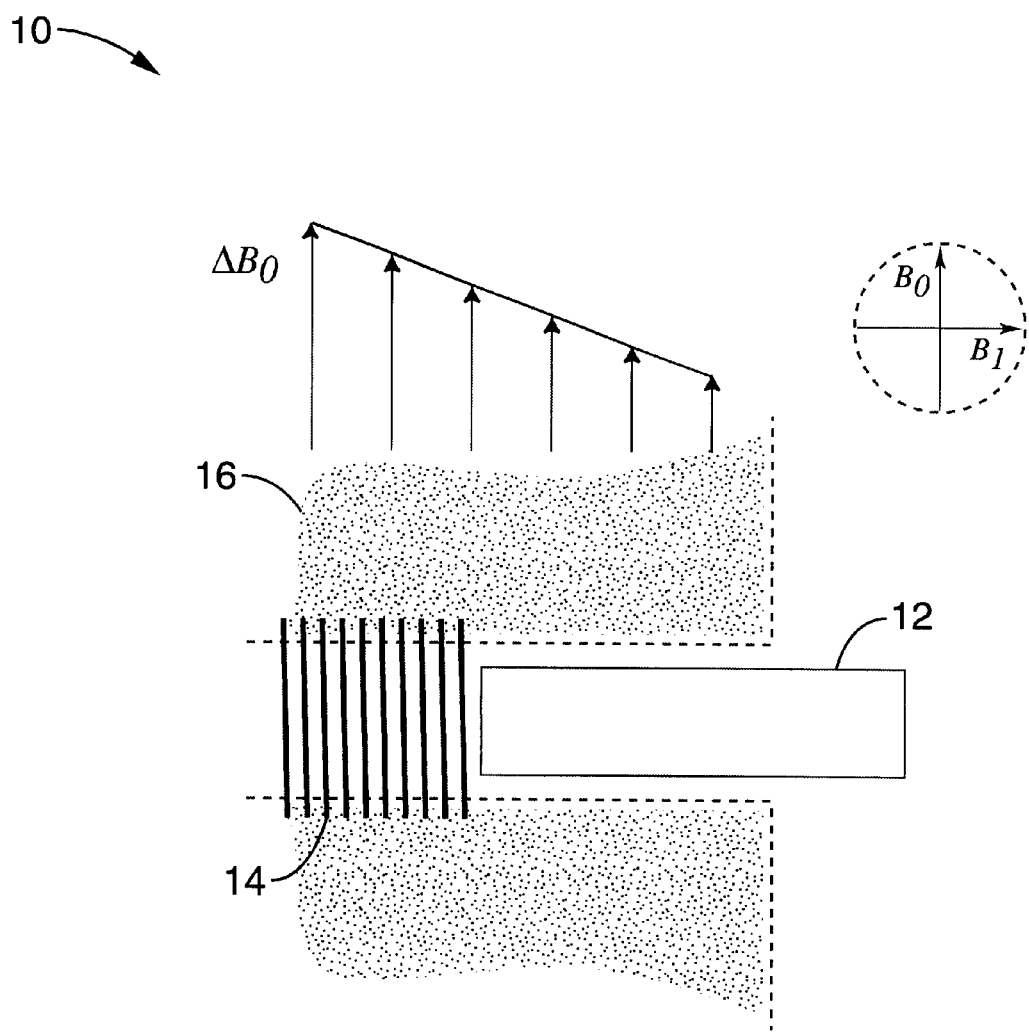
FIG. 1 is a schematic representation of a NMR probe head with the sample outside of the core of the probe head in inhomogeneous static and radio frequency fields.

A schematic representation of one embodiment of a probe head 10 is shown in FIG. 1. In order to emulate ex-situ conditions that are inside the magnet bore, a static $B_0$ field gradient was produced by driving a current into the x-gradient coils of the probe head. The sample 12 may then be attached outside the rf-coil 14. It can be seen in the probe head shown in FIG. 1, that a single solenoid serves to irradiate and detect the NMR proton signal from a sample of trans-2-pentenal contained in a glass tube inside the bore of a super-conducting magnet 16. In order to simulate the environment of an ex-situ surface coil, the sample is placed completely outside the solenoid central cavity when a static field gradient is applied. An imaging coil set, not displayed in the FIG. 1, is used to generate a linear gradient of the static field along the solenoid axis. The results of FIG. 2A through FIG. 2C, for example, were obtained through the use of a super-widebore imaging magnet using an Infinity Varian spectrometer operating at 179.12 MHz proton frequency and a home-built imaging probe head with three perpendicular gradient coils.

Figure 2A:
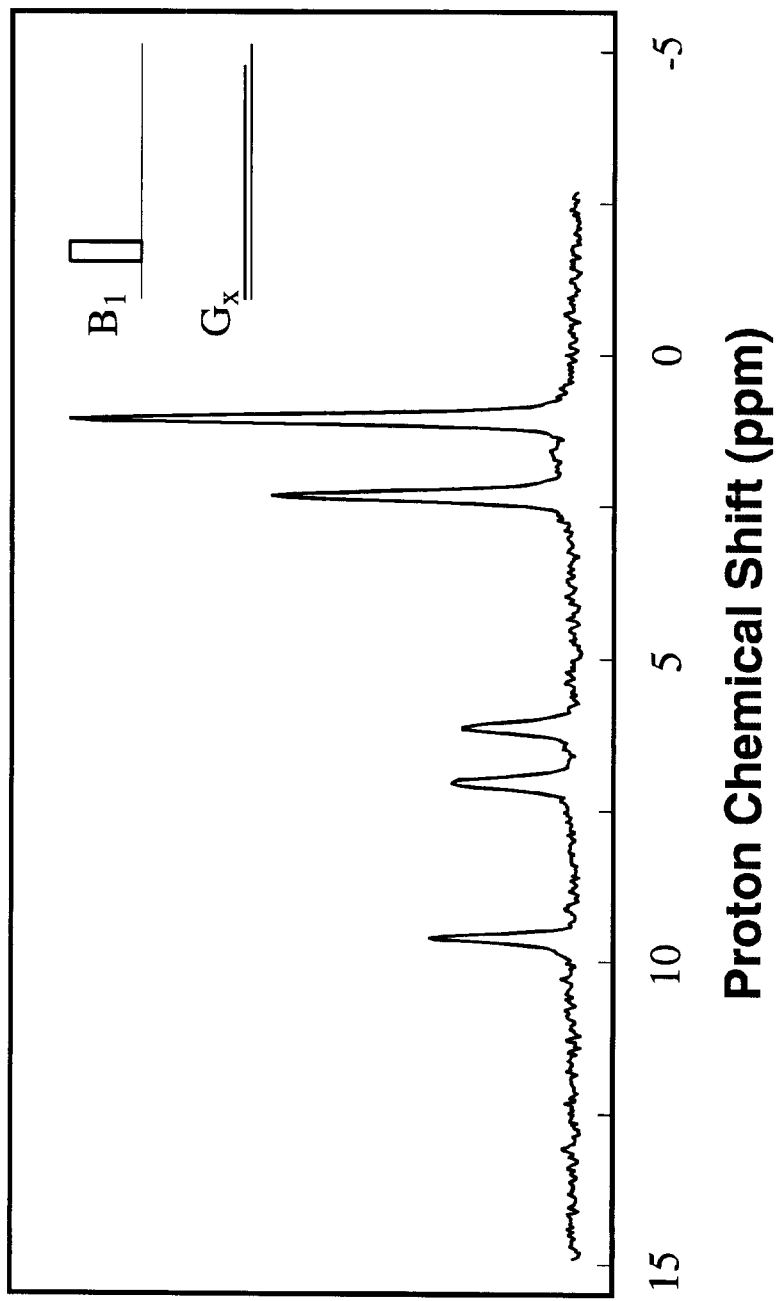
FIG. 2A is a conventional one-pulse NMR spectrum of trans-2-pentenal.

Referring next to FIG. 2A, the conventional $^1H$ (proton) NMR spectra of trans-2-pentenal in a tube of 5 mm diameter and 2 cm length is shown as a standard for purposes of comparison. It can be seen that the "normal" one-pulse free induction decay (FID) proton NMR spectrum in a rather homogeneous $B_0$ field, exhibits five resolved lines at 9.5, 7.0, 6.1, 2.4 and 1.1 parts per million (ppm) with relative intensities of 1:1:1:2:3 that correspond, respectively, to the formylic, the two olefinic, and the two aliphatic protons. The linewidths (~60 Hz) come essentially from the intrinsic residual inhomogeneity of the magnet.

Figure 2B:
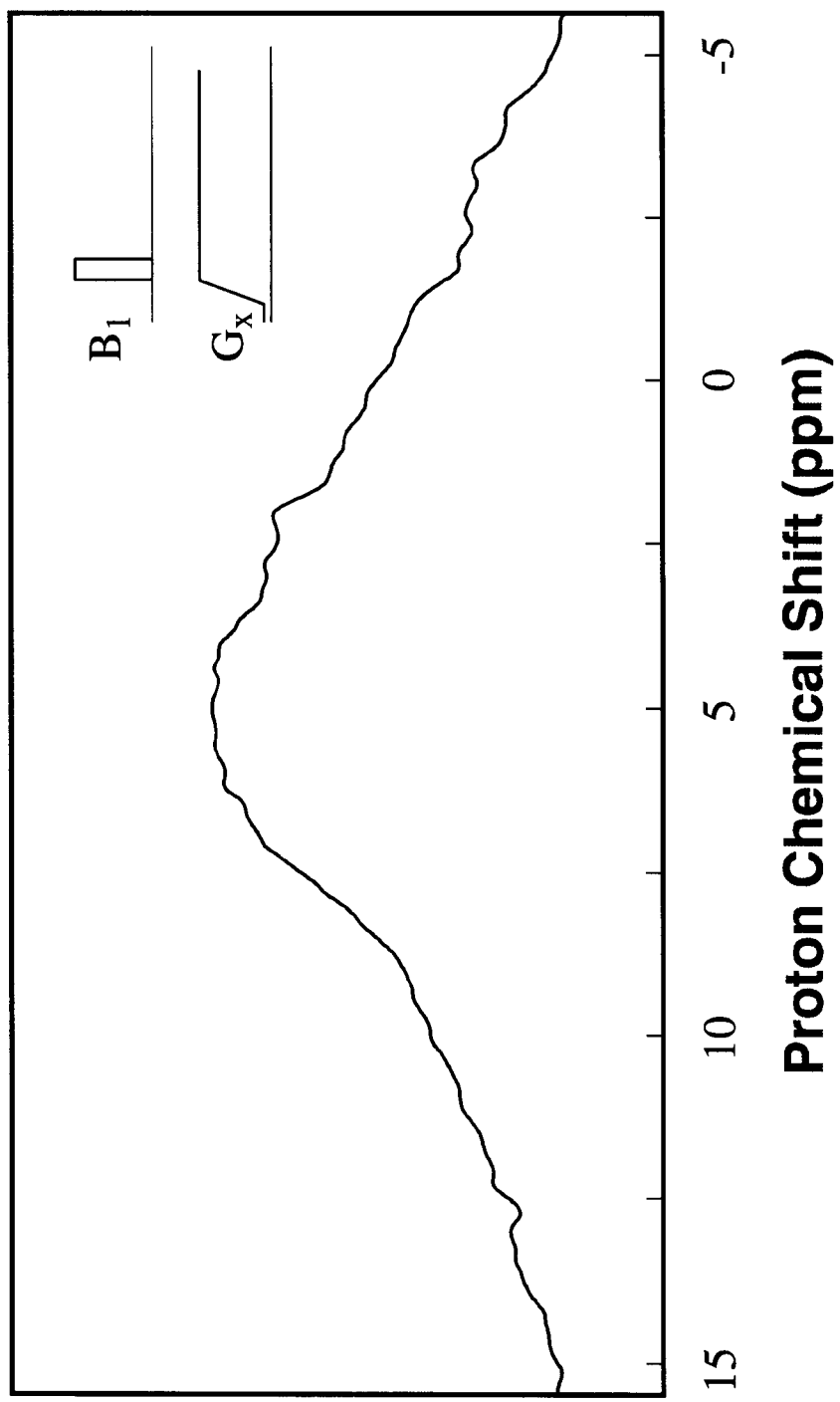
FIG. 2B is a one-pulse NMR spectrum of trans-2-pentenal in the presence of a linear static field gradient of 0.12 mT/cm along the sample axis.

Turning now to FIG. 2B, the $^1H$ (proton) NMR spectra of trans-2-pentenal in a tube of 5 mm diameter and 2 cm length outside of the bore of the magnet is shown. In FIG. 2B, the spectrum of trans-2-pentenal (64 scans, 2.2 kHz full-width at half maximum line broadening) in the presence of a linear static field gradient of 0.12 mT/cm (~5 kHz/cm) along the sample axis is shown. An exponential apodization of 50 Hz was applied to enhance the signal to noise ratio.

In the presence of a $B_0$ gradient of 0.12 mT/cm, the inhomogeneously broadened spectrum is rendered featureless and extends over a range of 20 ppm, nearly twice the ordinary chemical shift range of proton NMR spectra. Clearly, any chemical shift information is hidden in this broadened spectrum.

Figure 2C:
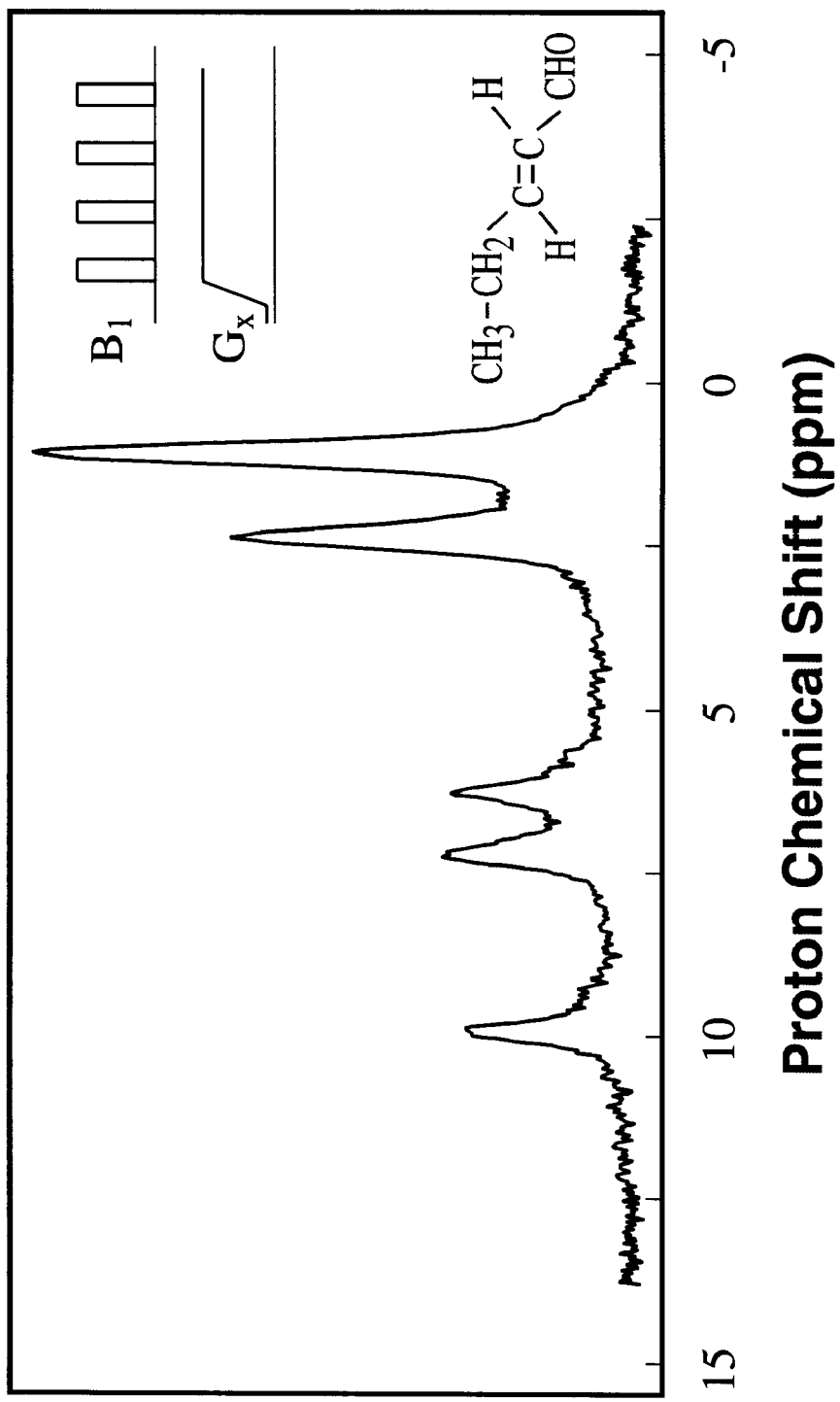
FIG. 2C is an NMR proton spectrum of trans-2-pentenal obtained after the application of a refocusing sequence according to the present invention as shown in FIG. 3B.

Referring now to FIG. 2C, it can be seen that the spectral resolution can be recovered and full chemical shift information can be obtained in a sample subjected to strong static field inhomogeneity and excited by a surface coil. The spectrum shown in FIG. 2C was obtained by the use of an appropriately designed train of composite z-rotation pulses according to the present invention in the presence of the same field inhomogeneity as shown in FIG. 2B. Thus, trains of z-rotation pulses inducing nutation echoes over a region of matched rf and static field gradients revives the spectroscopic resolution of all five proton NMR lines seen in the standard spectra shown in FIG. 2A.

Figure 4A:
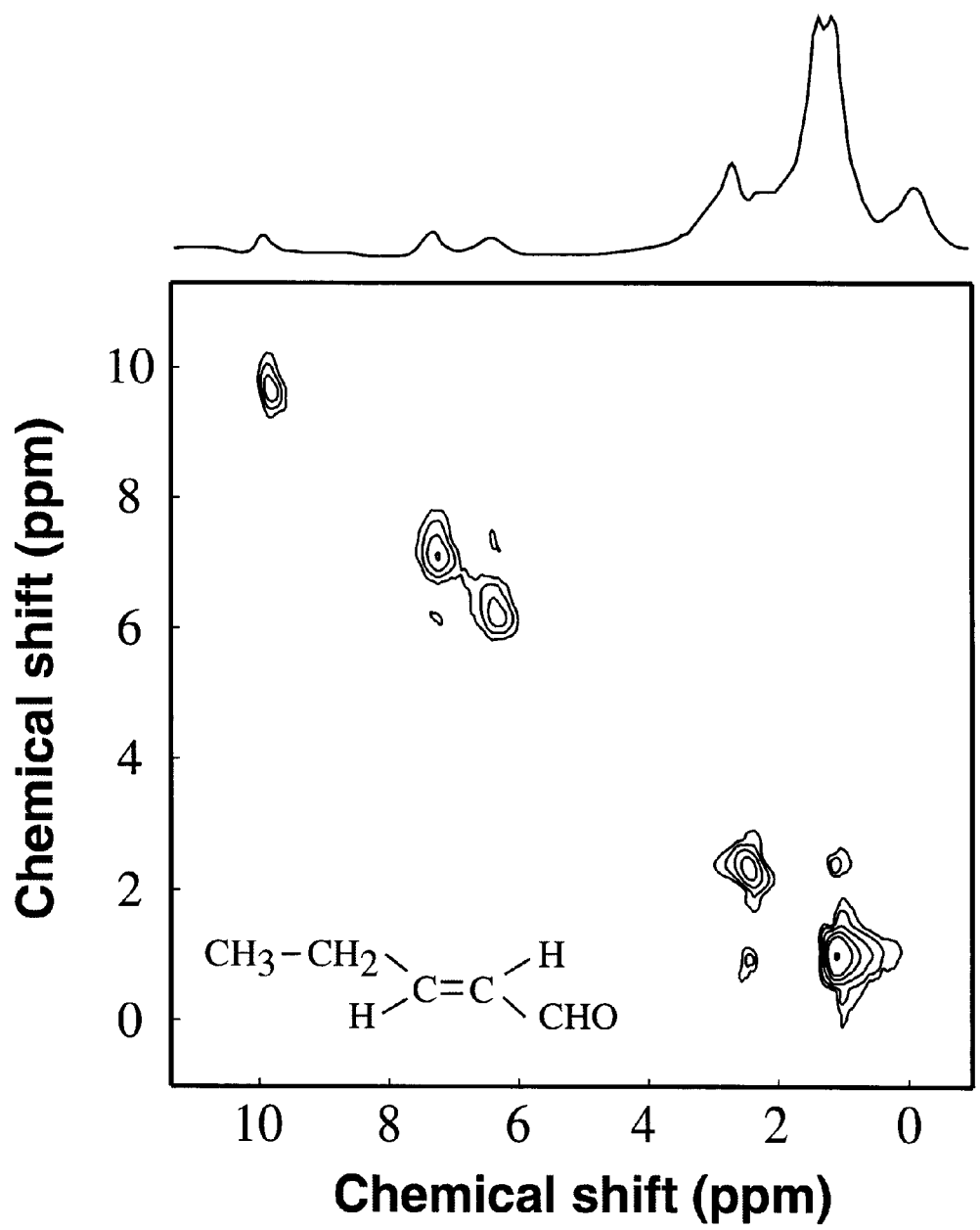
FIG. 4A is correlation spectrum in absolute value mode of a trans-2-pentenal obtained through the use of the train of pulse sequences shown in FIG. 4B.
Figure 4B:
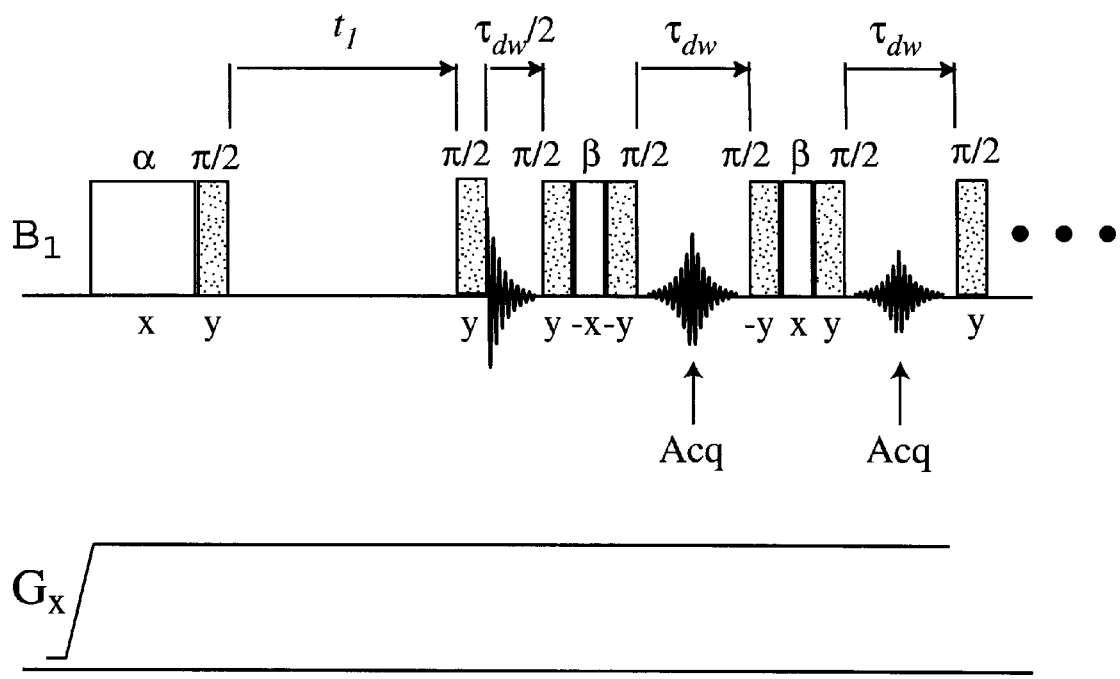
FIG. 4B is an adapted COSY sequence under conditions identical to those of FIG. 2B and providing the spectrum of FIG. 4B.

In the example shown in FIG. 2C, the proton spectrum was obtained using the refocusing sequence seen schematically in FIG. 4B after 64 scans, in the presence of the same field gradient that produced FIG. 2B. Constant-rotation composite $\pi/2$-pulses were implemented by the series $(2\gamma)_{97.2}(4\gamma)_{291.5}(2\gamma)_{97.2}(\gamma)_0$ where $\gamma$ represents a nominal $\pi/2$-pulse. The total duration was 117 $\mu s$; $\tau_\beta$, the length of the $\beta$-pulse, was 23 $\mu s$ for an evolution time $\tau_{dw}$ set at 250 $\mu s$. After processing the FID, the frequency units were shifted so that the position of the most intense peak matched the corresponding peak observed in standard reference shown in FIG. 2A. Even though the line-width is slightly increased, all non-equivalent proton resonances are resolved and the full chemical shift information is recovered.

Thus it can be seen that spectroscopic information may be obtained from a sample subjected to strong rf and static field inhomogeneities through the use of a spatial correlation between the gradients of these two fields. Correlation in this context addresses the condition:

$$dB_0(x)/dx = k \times dB_1(x)/dx; \; B_0(x) \times B_1(x) = 0$$

where $B_0(x)$ and $B_1(x)$ represent respectively the static and radio frequency fields at any point in the space.

The following pulse sequence, for example, is effective for extended samples located outside the excitation coil in the presence of an inhomogeneous magnetic field ($\Delta\omega = 10$ kHz) for protons. In this example, the gradient of the radio frequency field is proportional to the gradient of the static magnetic field: ($\Delta\omega_0(r)/\Delta\omega_1(r) = $const).

1. The first pulse nutates the spins about an angle:

$$\beta = B_1(r)\tau_p = [\omega_1 + \Delta\omega_1(r)]\tau_p$$

where $\omega_1(r)$ is the strength of the rf-field at point r and $\tau_p$ the duration of the pulse. The magnetization of each spin $I_i$ is thus dephased in the yz-plane according to:

$$\rho_i = I_{iz} \cdot \cos\beta(r) - I_{iy} \cdot \sin\beta(r).$$

2. A 90° constant rotation composite pulse about the y-axis brings all magnetization vectors into the xy-plane:

$$\rho_i = I_{ix} \cdot \cos\beta(r) - I_{iy} \cdot \sin\beta(r).$$

3. Free precession of the spins under the influence of the magnetic field offset $\Delta\omega_0(r)$ and their individual chemical shift $\Omega_i$ during $\tau$ according to:

$$\rho_i = [I_{ix} \cdot \cos\beta(r) - I_{iy} \cdot \sin\beta(r)] \cdot \cos[(\Delta\omega_0(r) + \Omega_i) \cdot \tau] +$$
$$[I_{iy} \cdot \cos\beta(r) + I_{ix} \cdot \sin\beta(r)] \cdot \sin[(\Delta\omega_0(r) + \Omega_i) \cdot \tau].$$

4. After a time $\tau = \tau_p \Delta\omega_1(r)/\Delta\omega_0(r)$ the effect of the inhomogeneous magnetic field is refocused while the chemical shift information is maintained. At this step a data point is acquired:

$$\rho_i = I_{ix} \cdot \cos(\Omega_i \cdot \tau + \omega_1 \cdot \tau_p) + I_{iy} \cdot \sin(\Omega_i \cdot \tau + \omega_1 \cdot \tau_p).$$

5. A 90° constant rotation composite pulse about the y-axis brings the magnetization back into the xz plane:

$$\rho_i = I_{iz} \cdot \cos[n(\Omega_i \cdot \rho + \omega_1 \cdot \rho_p)] + I_{iy} \cdot \sin[n(\Omega_i \cdot \tau + \omega_1 \cdot \tau_p)].$$

6. The preceding pulse cycle is repeated continuously. Stroboscopic acquisition of the magnetization at the end of each free precession period $\tau$ gives the FID with the magnetization after n cycles being:

$\rho_t = I_{iz} \cdot \cos[n(\Omega_i \cdot \rho + \omega_1 \cdot \rho_p)] + I_{iy} \cdot \sin[n(\Omega_i \cdot \tau + \omega_1 \cdot \tau_p)]$.

It can be seen that the resulting spectrum contains the full chemical shift information. This sequence induces an overall frequency shift of $\omega_1 \cdot \tau_p/\tau$ which can be corrected either during the pulse sequence by a phase shift at each step or by numerical correction while processing the FID. A refinement of this pulse sequence involves the symmetrization $(\beta_x\ 90°_y\ \tau 90°_y\ \beta_{-x}\ 90°_{-y}\ \tau 90°_{-y})_n$, which corrects for the evolution during the $\beta$ pulses.

Figure 3A:
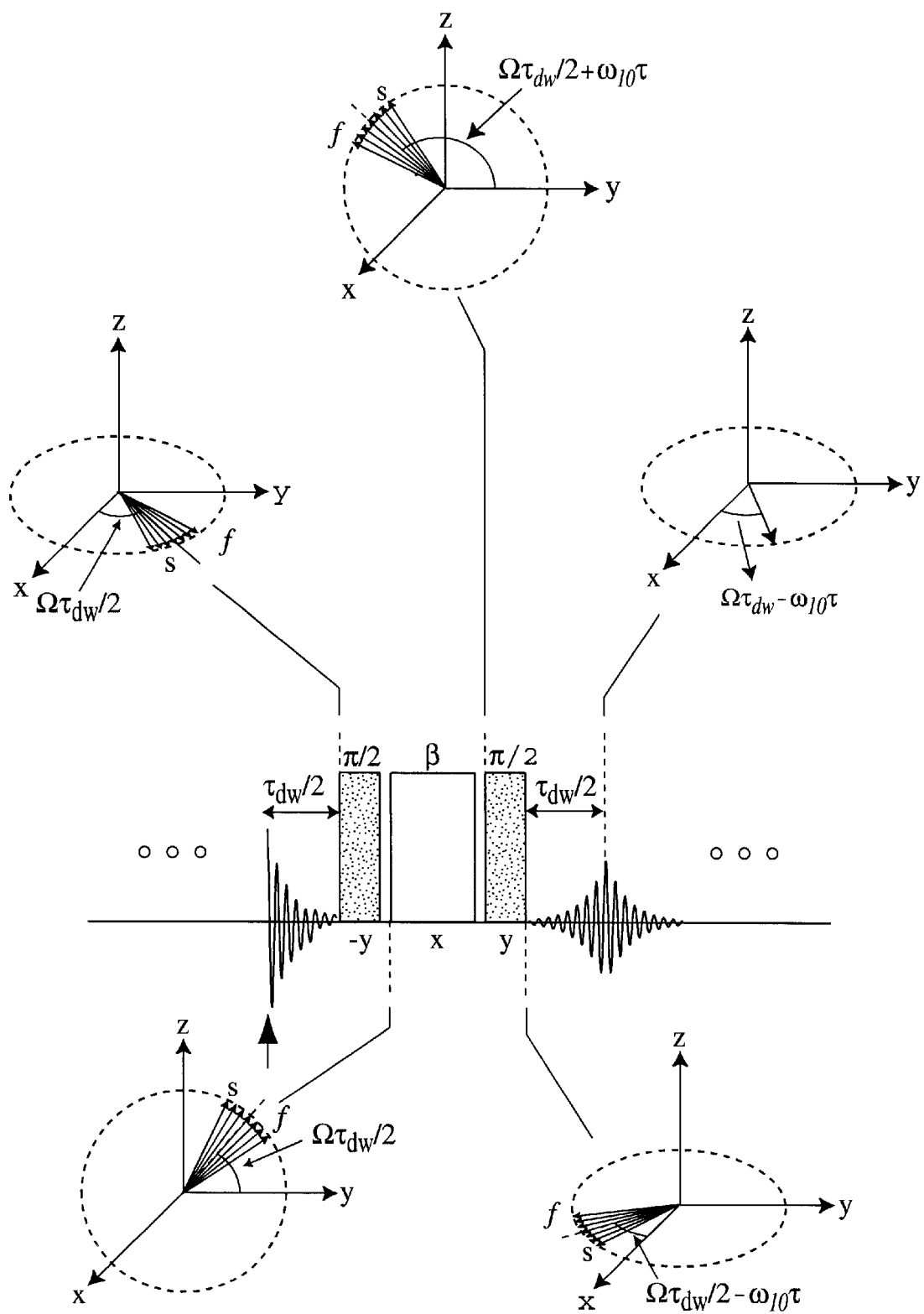
FIG. 3A is a rotating-frame diagram describing the spin evolution under a single sequence of z-rotation composite pulses according to the present invention at different positions along the sample and depicting spins with the same chemical shift for clarity.

The basic mechanism underlying the use of composite z-rotation pulses can be visualized by means of a classical vector diagram in the rotating frame as seen in FIG. 3A illustrating spin evolution under a sequence of z-rotation composite pulses. For the sake of clarity, FIG. 3A only depicts nuclear spins with the same chemical shift but spread over different positions along the sample. "Faster" or "slower" spins, located closer to or away from the excitation coil, have been labeled by a small f(s) in FIG. 3A.

For spins with the same chemical shift, different Larmor frequencies $\omega_0(\vec{r})$ throughout the sample give rise to progressive dephasing during a free-evolution period. At any stage, this loss of coherence can be reversed if a proper position dependent phase correction is applied. Note, however, that, by doing so, phase differences accumulated during the evolution and arising from the chemical shifts and scalar J couplings are maintained. Such a position dependent phase correction can be accomplished by using a z-rotation pulse $(\beta(\vec{r}))_{-z} = (\pi/2)_y (\beta(\vec{r}))_x (\pi/2)_{-y}$.

Even in the presence of rf inhomogeneity and offset, carefully designed constant-rotation composite $\pi/2$-pulses ensure a 90° rotation for a major part of the sample contributing to the induced signal. However, the rotation angle $\beta$ depends on the local rf strength $\omega_1(\vec{r})$ and for a fixed pulse length $\tau_\beta$, the phase correction at each site is given by $\beta(\vec{r}) = \omega_1(\vec{r})\tau_\beta$. If k denotes the (position-independent) ratio between the static field and the rf gradients, the length of the $\beta$-pulse for a given free evolution interval $\tau_{dw}$ is selected so that $\tau_\beta = k\tau_{dw}$. By this method, a nutation echo takes place at a time $\tau_{dw}/2$ after the z-pulse is applied. Accounting for an overall and constant phase shift $\omega_{10}\tau_\beta$, the measured signal at this single point is insensitive to field inhomogeneities but fully preserves the chemical shift evolution during the period $\tau_{dw}$.

Figure 3B:
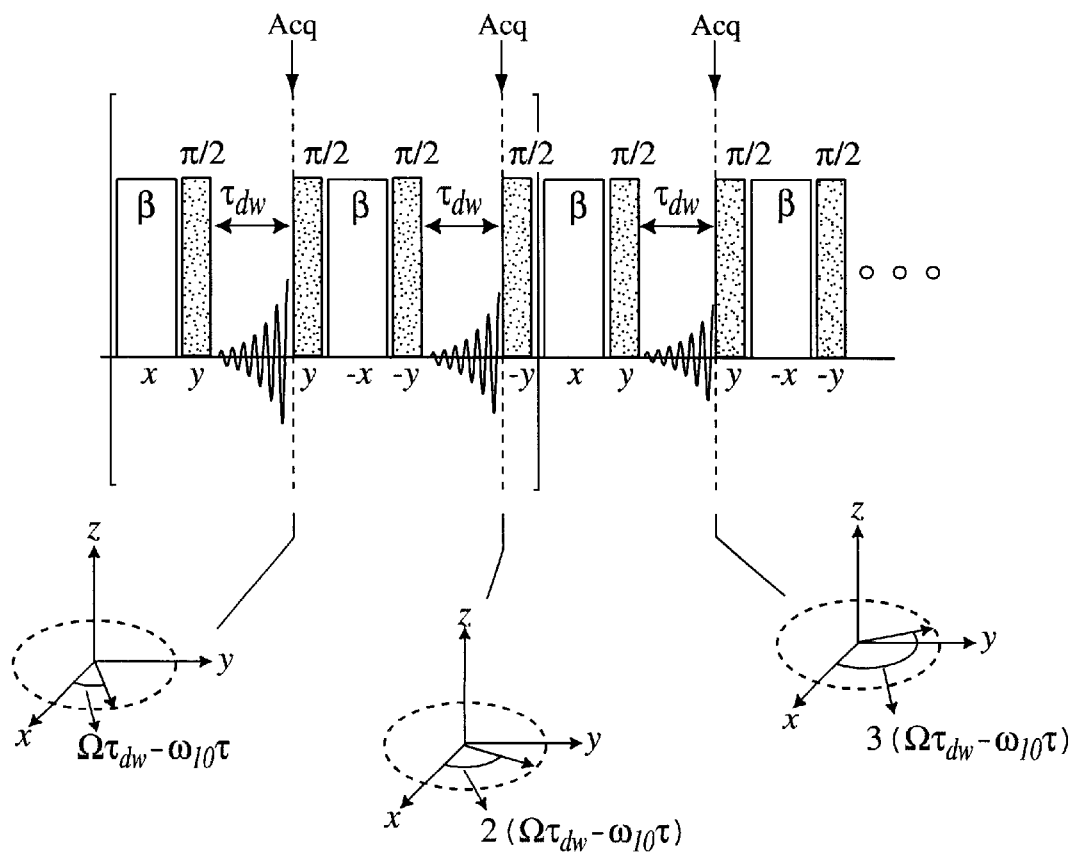
FIG. 3B is a is a rotating-frame diagram describing the spin evolution under a train of single sequences of z-rotation composite pulses according to the present invention at different positions along the sample and depicting spins with the same chemical shift for clarity.

A generalization of the principle that combines the repeated application of composite z-rotation pulses with stroboscopic acquisition enables the direct detection of resolved NMR spectra in inhomogeneous fields is shown schematically in FIG. 3B. Point-by-point acquisition with a sequential increment of the $\beta$-pulse length is contemplated as well. However, as in the Carr-Purcell train, incomplete refocusing due to molecular diffusion is best suppressed by keeping the free evolution time sufficiently short.

Accordingly, in the pulse scheme shown in FIG. 3B, the magnetization is initially dephased by a $\beta$-pulse of duration $\tau_\beta$ prior to the free evolution period $\tau_{dw}$. At the end of this period, a nutation echo takes place and a single point acquisition is made. Immediately after another constant rotation composite $\pi/2$-pulse tips the magnetization back onto zy plane and the cycle starts again. The phase shift introduced at each step of the train can be easily corrected by properly changing the phase of the synthesizer or by a frequency shift of the whole spectrum after processing the FID. In either case, this procedure provides a spectrum that, despite strong field inhomogeneities, still contains the full chemical shift information of the sample.

A closer examination of the spectral results shown in FIG. 2C, reveals that the chemical shift scale is slightly enhanced with respect to the conventional spectrum, an effect that arises from the evolution of the nuclear magnetization under the field offset during the composite $\pi/2$ pulses. This renders the effective dwell time slightly longer than the free evolution period $\tau_{dw}$ used for the Fourier transformation. A correction can be applied by simply rescaling the shift scale. Undesired offset-induced evolution during the rf pulses also leads to spectral artifacts that distort neighboring peaks around the irradiation frequency. However, the results shown in FIG. 2C show that these effects can be overcome to a great extent by a phase alternation on the composite z-rotation pulses at each step of the pulse train shown in FIG. 3B. Further improvement can be obtained by tuning the rf toward lower frequencies (corresponding to spins located further away from the coil). If the rf field is high enough, this ensures that most nuclei significantly contributing to the signal experience a reduced offset effect during the $\beta$-pulse.

The maximum available rf field (in this case, 25 kHz for spins immediately close to the rf coil) sets a practical limit on the gradient strength that can be handled; e.g. the higher the field inhomogeneity, the greater the rf power required in order to maintain the $\beta$-pulse offset independent in the region of interest. Under the conditions shown in FIG. 2C and FIG. 3B, resolved spectra in field gradients of up to 0.5 mT/cm (~20 kHz/cm) have been successfully obtained. The gradient can be further increased if the composite $\pi/2$ pulses are replaced by single pulses of adjustable length. When this length matches the 90° condition for on-resonance nuclei, a highly spatially selective excitation occurs that still provides extremely sharp spectra, with a correspondingly diminished sensitivity.

EXAMPLE 2

Figure 5:
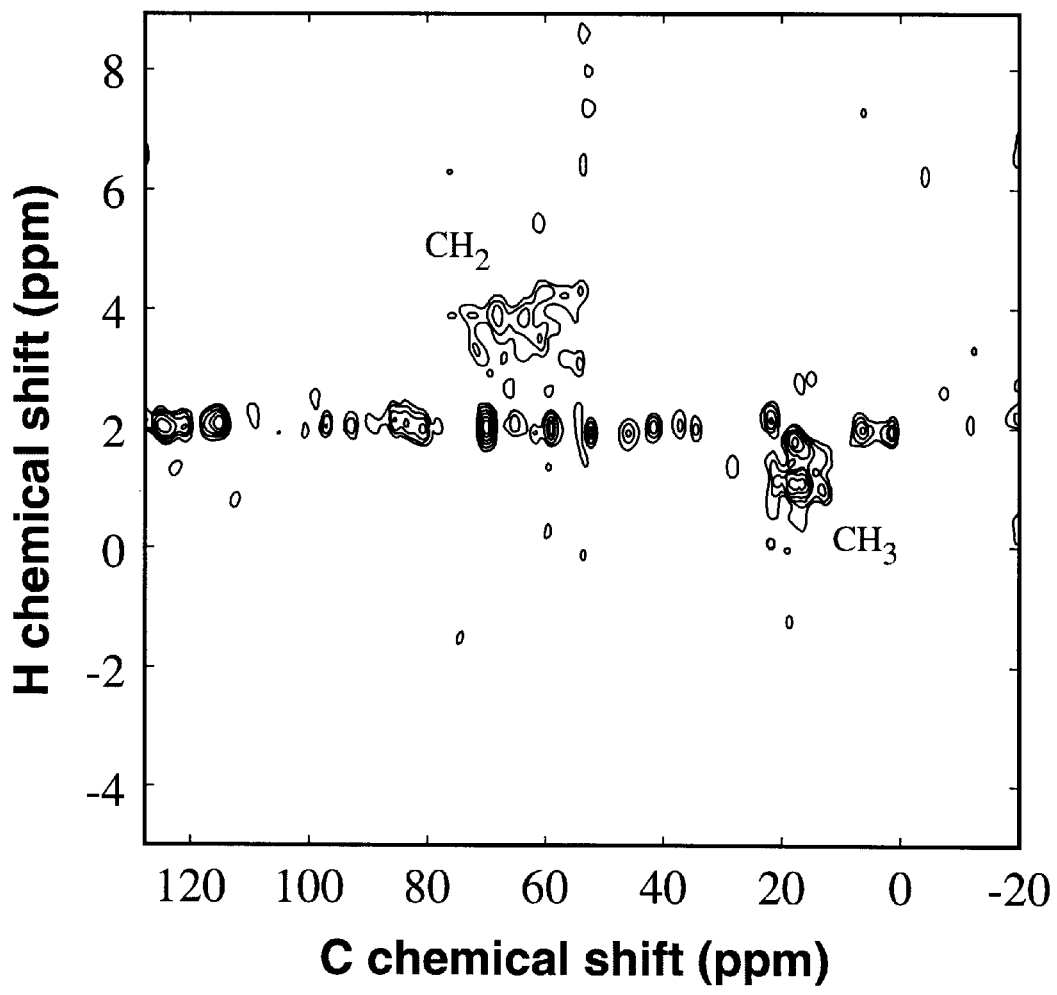
FIG. 5 is a two-dimensional H, C HETCOR NMR correlation spectrum of ethanol in a static field gradient using pulse sequences according to the present invention.

Referring now to FIG. 4A, FIG. 4B and FIG. 5, the extension of the preceding principles to multidimensional spectroscopy is straightforward and its application is extended towards the homo- and heteronuclear two-dimensional correlation experiments COSY and HETCOR.

FIG. 4A shows a two-dimensional (2D) correlation spectrum (absolute value mode) of trans-2-pentenal that was obtained through an adapted COSY sequence under conditions identical to those of FIG. 2B. The adapted COSY sequence is shown schematically in FIG. 4B.

It can be seen that a linear static field gradient of 0.12 mT/cm (~5 kHz/cm) along the sample axis spreads the Larmor frequencies in both dimensions over a range of 20 ppm and no relevant spectroscopic information can be recorded with a standard experiment.

In the present illustration, however, the evolution period is made insensitive to field inhomogeneities by the use of a pulse $(\alpha(\vec{r}))_x$ before the standard $(\pi/2)_y$ excitation pulse. The duration of $(\alpha(\vec{r}))_x$ is sequentially incremented in a manner proportional to $t_1$. The ratio is adjusted so that the next $(\pi/2)_y$ mixing pulse occurs synchronously with the nutation echo. In the direct dimension, the detection is made stroboscopically in a way similar to that of FIG. 3C. After a timer $\tau_{dw}/2$, a composite z-pulse is applied and the dephasing due to inhomogeneities is reversed. A single point acquisition takes place at the expected nutation echo time between the pulses of the train. All diagonal peaks as well as most of the cross peaks for J-coupled protons are regained (a higher level contour for peaks belonging to aliphatic protons has been used to improve resolution).

The number of increments for $t_1$ was 64 in steps of 250 ps in the example shown. This was also the value assigned to $\tau_{dw}$ ensuring the same bandwidth for both dimensions. The number of scans for each evolution time $t_1$ was 8. Thus, in FIG. 4A, cross peaks indicating J-coupled proton spins are still recognizable even though the field inhomogeneity is sufficient to completely erase any spectroscopic information.

EXAMPLE 3

Similarly, as seen in FIG. 5, a first two-dimensional H,C HETCOR NMR correlation spectrum of ethanol in a static field gradient was obtained. A linear static field gradient of 0.24 mT/cm (=10 kHz/cm) along the sample axis spreads the Larmor frequencies in the proton dimension over a range of 75 ppm, in the carbon dimension over a range of 180 ppm, and absolutely no relevant spectroscopic information can be recorded with a standard experiment. The number of scans for each evolution time was 128. The refocusing HETCOR sequence was similar to the COSY sequence displayed in FIG. 4A, with direct polarization on the protons and stroboscopic detection of the carbon magnetization. The two cross-peaks of the $CH_2$ and the $CH_3$ group are clearly resolved and thus yield unambiguous assignment information.

Accordingly, a method is provided for resolving chemical shifts in ex-situ NMR spectra through the use of multiple-pulse sequences of correlated, composite z-rotation pulses. By matching the shapes of the rf and static field inhomogeneities, a nutation echo is induced that, in contrast to the standard Hahn-echo, preserves the chemical shift information in both dimensions.

EXAMPLE 4

Alternatively, similar results may be obtained by an extension of the procedure of the present invention that only uses variable static field gradients. If, by a proper design of the magnet, the field inhomogeneity can be changed, a field and/or rf pulse sequence is possible that retains the spectroscopic information.

In this embodiment of the invention, full spectroscopic information of a sample may be obtained if a period of free evolution under a static field gradient is followed by another period with the field gradient reversed. In the context of ex-situ NMR, this concept could be implemented by the application of a magnetic field with a "saddle point" with the saddle point position being determined by the application of auxiliary currents. The sample would be located on one side of the saddle point during the first period will experience an opposite gradient if the saddle point is appropriately displaced for the second period. This procedure represents an extension of the sequence discussed above, now based on the degree of correlation attainable with static field matching on both sides of the saddle point. Both the effective sample size and the magnitude of the external field (and field gradient) could be potentially increased by this means since offset problems affecting the performance of rf pulses, constrained to the excitation pulse, play here a secondary role.

Figure 6:
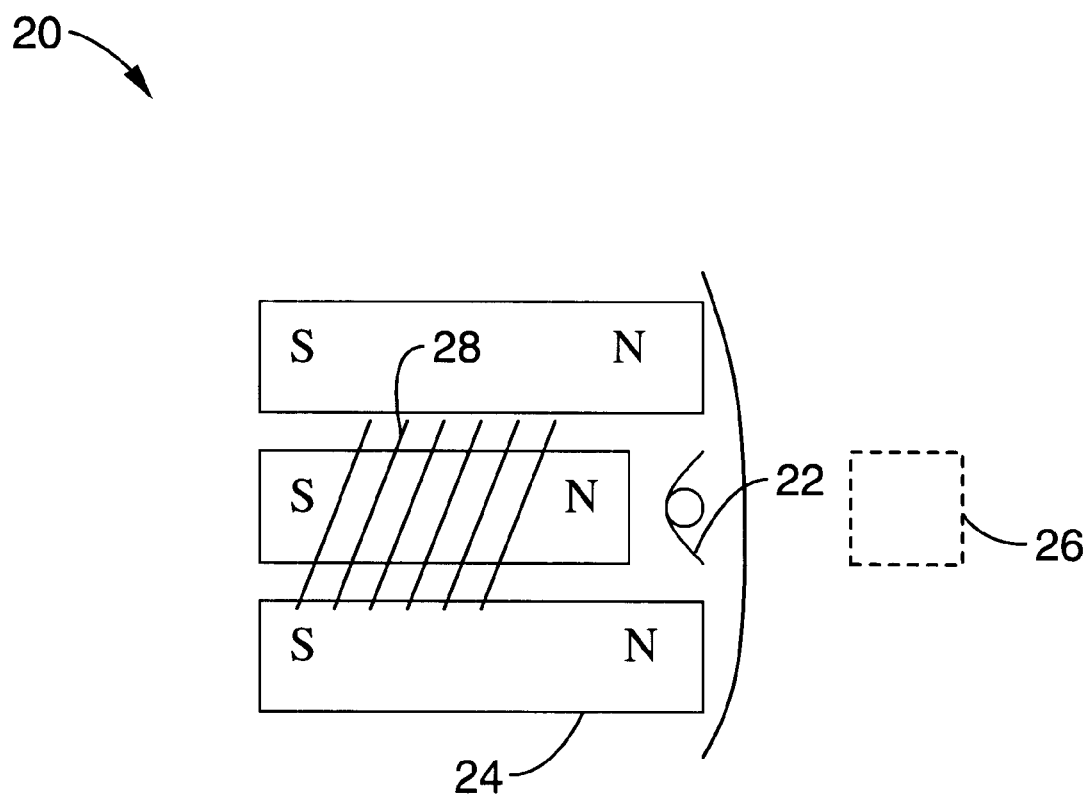
FIG. 6 is an alternative embodiment of a probe head with permanent magnets and switchable coil providing a variable saddle point.

Referring now to FIG. 6, an alternative probe head is schematically represented. Probe head 20 has an antenna 22 and three permanent magnets 24 that collectively generate a static magnetic field whose spatial dependence exhibits a saddle point 26. Due to the smooth variation of the static magnetic field, the on-resonant detection is usually made at the saddle point 26. The location of the saddle point 26 depends on the relative positions and intensities of the magnets 24, and, to some extent, can be controlled by adding solenoids at proper positions. Accordingly, a probe head with a variable saddle point may be provided.

Figure 7:
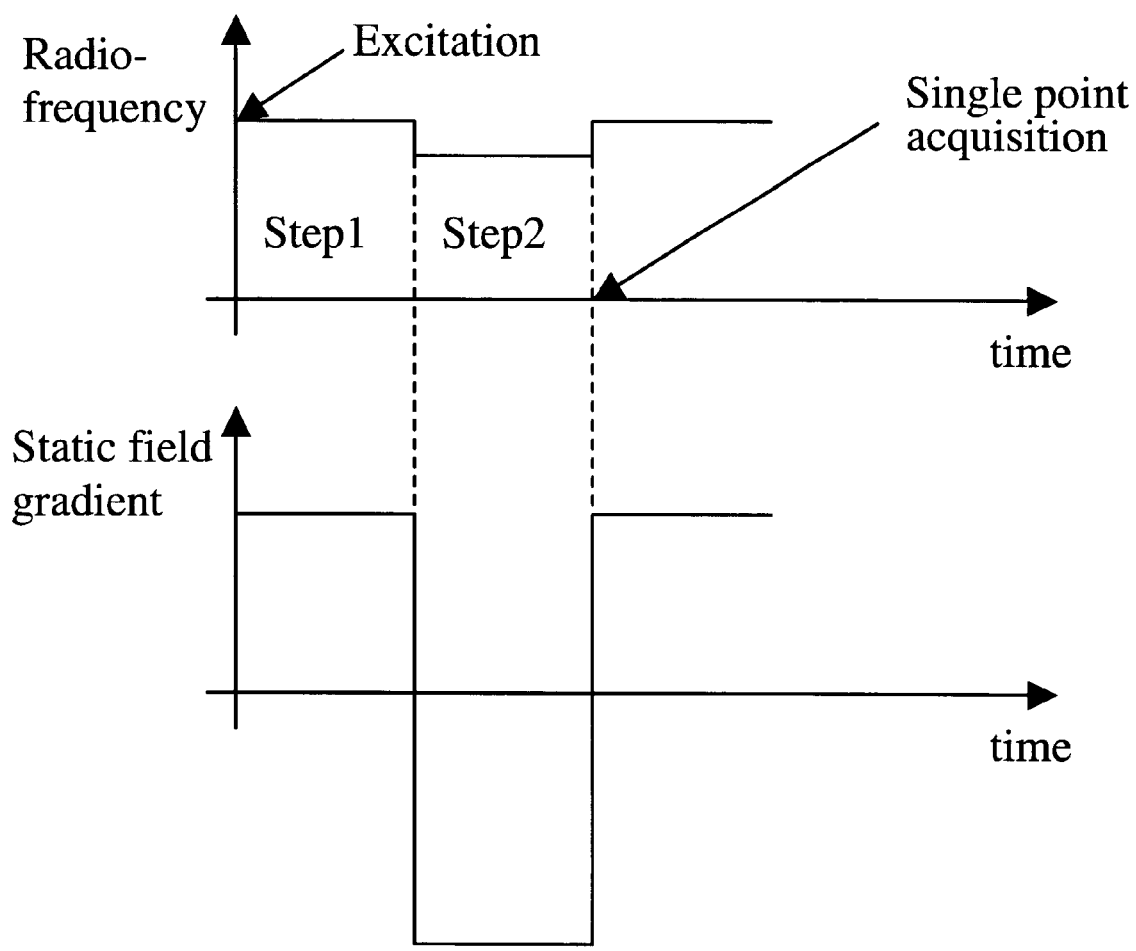
FIG. 7 is a schematic diagram of one pulse sequence using a variable saddle point according to one embodiment of the present invention wherein the sample experiences a reversed static field gradient at the saddle point during the sequence.

Referring also to FIG. 7, one possible rf gradient sequence using a variable saddle point is schematically illustrated. The sequence shown in FIG. 7 includes two general steps that occur over time. Initially, it can be seen that when the coils 28 are off, the sample is located so that the saddle point completely lies on one side (the static field decays monotonously along the sample). In Step 1 of the sequence, the rf frequency is tuned so that on-resonance spins lie on the surface and then, an inhomogeneity free excitation pulse is applied. After a short period of evolution, the coils 28 are switched on so that the saddle point 26 is displaced deeper towards the sample in Step 2. Simultaneously, the frequency is reset so that spins located on the surface of the sample are still on resonance. Under these new conditions, all spins located between the surface and the saddle point experience a reversed static field gradient. If the saddle point is symmetric enough, inhomogeneities are refocused without affecting differences due to the chemical shift. After a gradient cycle, a single point acquisition is made.

This gradient train can be combined with the former rf-pulse sequence now used as a shim to properly "shape" the effective gradients affecting the spin evolution at each step of the sequence. It will be further understood that by simply extending the length of the first free evolution period, a one-dimensional chemical shift resolved image is possible.

Figure 8:
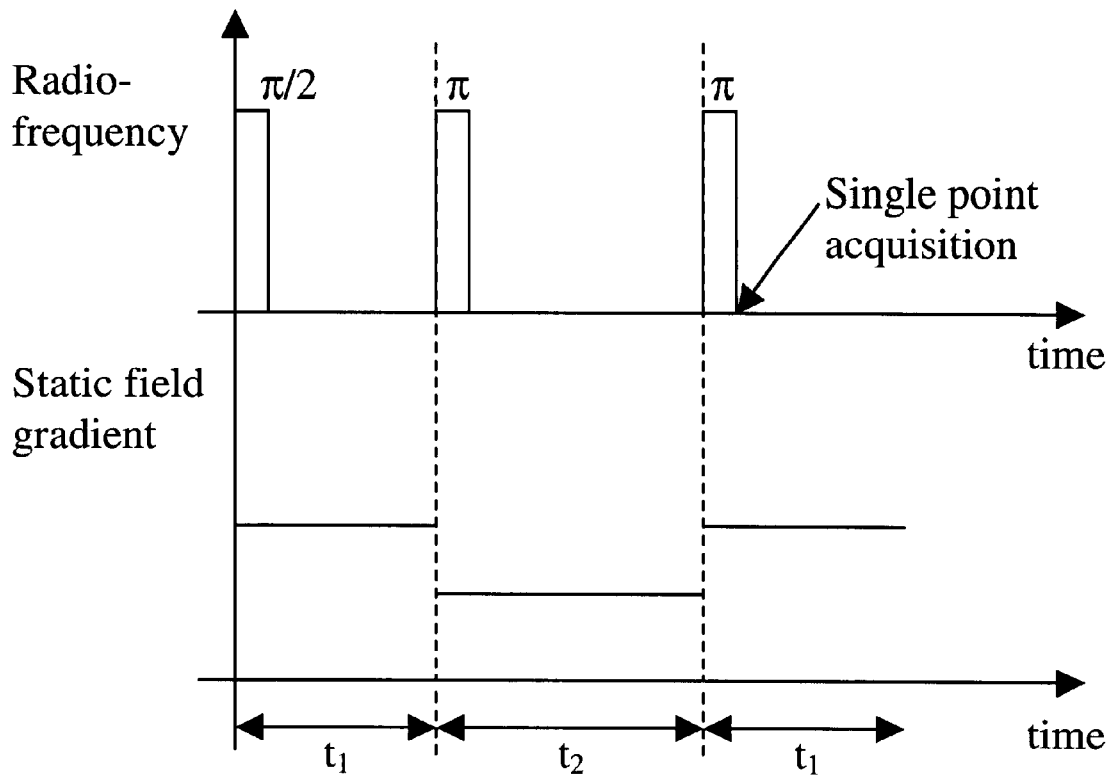
FIG. 8 is a schematic diagram of an alternative pulse sequence using a variable saddle point according to one embodiment of the present invention when the static field gradient cannot be reversed.

Turning now to FIG. 8, one possible sequence for use when the field gradient cannot be reversed by the use of a saddle point is schematically illustrated. If the field gradient cannot be reversed by the use of a saddle point, spectroscopic information can still be obtained if a field cycle is applied that affects the ratio between the field and the gradient. In this case, and after an inhomogeneity free $\pi/2$ pulse, a short period of free evolution $t_1$ takes place. A constant rotation $\pi$ pulse is then applied and the gradient is changed and, if necessary, the reference frequency is readjusted). A free evolution $t_2$ over a different (and properly selected) time period takes place that refocus all static field inhomogeneities. However, phase differences due to chemical shift are not completely erased. A new $\pi$ pulse is applied and a single point acquisition is made whose amplitude and phase represent the chemical shift evolved over an effective period proportional to the difference $t_2-t_1$. By repeating the sequence, a full FID free of inhomogeneous broadening can be acquired.

EXAMPLE 5

It can be seen that the detection of chemical shift resolved NMR spectra relies substantially on the attainable matching of the rf gradient and the static field gradient or on the matching of the complimentary sides of a mobile saddle point of the static field. Such matching may be difficult over an extended region of the sample and a residual broadening of the spectrum may result. In addition, since the non-matched regions of the sample are ultimately eliminated from the signal, the sensitivity diminishes. Accordingly, to overcome these conditions, it is desirable to design composite pulses with an appropriate functional dependence of the nutational amplitude on $\omega_1$. With a given surface coil, the evolution during defocusing pulses now results from the combination of its intrinsic rf profile and the $\omega_1$ response of the pulse.

Figure 9A:
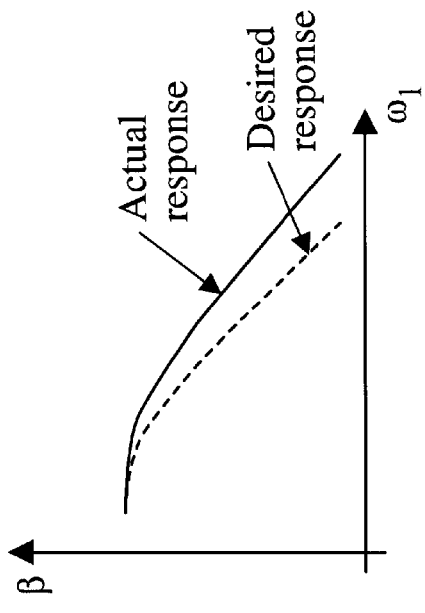
FIG. 9A is a graph of typical rf and static field profiles along the sample with the rf-profile shown as a solid line.
Figure 9B:
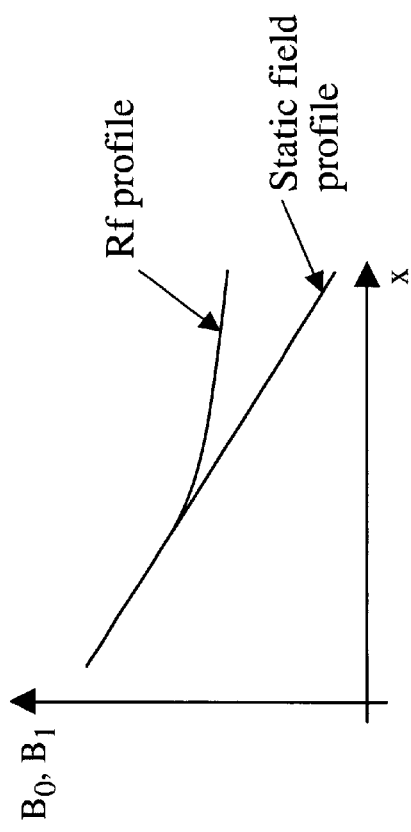
FIG. 9B is a graph of the defocusing angle as a function of the nutation amplitude with the actual response shown as a solid line and the desired response shown as a dashed line.
Figure 9C:
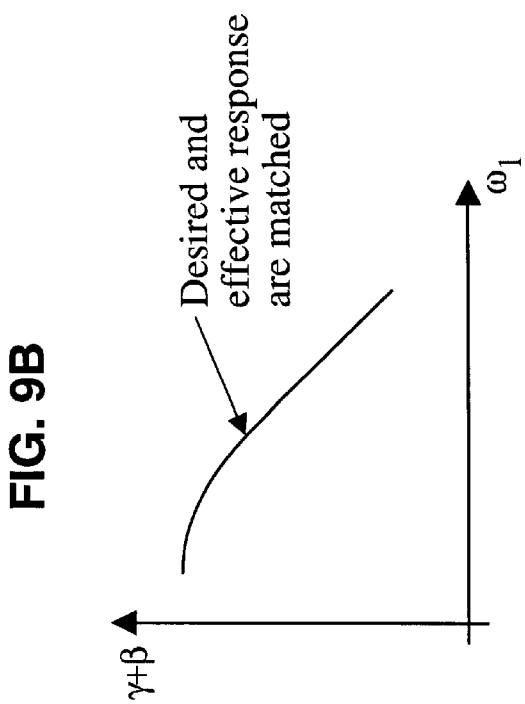
FIG. 9C is a graph of 360° pulse as a function of nutation amplitude.
Figure 9D:
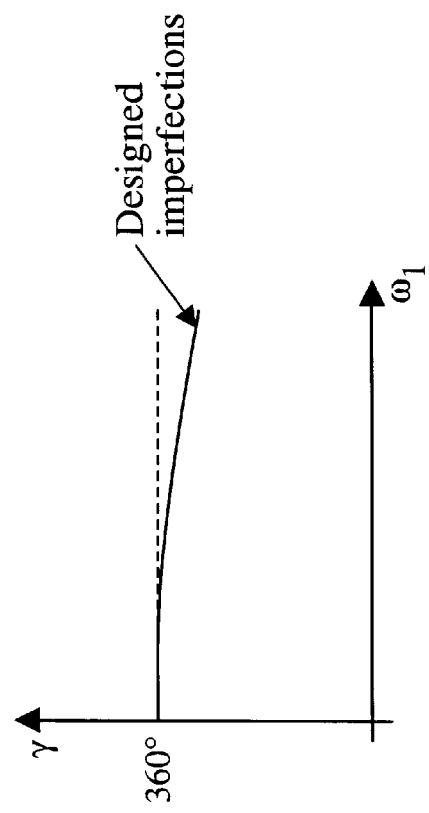
FIG. 9D is a graph of a composite pulse profile as a function of nutation amplitude that ultimately provides for the desired spatial response.

As seen in FIG. 9A, the static field ($B_0$) gradient, shown in the solid line and the rf field ($B_1$) gradient, shown in dashed lines, are mismatched along the sample (x). If a plain $\beta$ pulse is applied refocus the magnetization, those spins located on the sample where the gradients are mismatched will experience an rf gradient larger than expected and the refocusing will be imperfect as seen in FIG. 9B. FIG. 9B shows the defocusing angle β as a function $\omega_1$ and the actual response is shown in solid lines while the desired response is shown in dashed lines. The noted refocusing errors may be overcome by the application of a pulse with a nominal value of 360°, labeled as γ in FIG. 9C, immediately after the β pulse if the pulse dependence on $\omega_1$ is properly designed. In this embodiment, the composite pulse β' i.e. (γ+β) in combination with the previously known rf profile provides the desired spatial response. The modified performance of the refocusing composite pulse is shown in FIG. 9D and it can be seen that the desired and effective responses are matched. In this setting there is no need to separate corrective 360° pulses from the plain β pulse. Furthermore, integrated composite β pulses with more involved $\omega_1$ dependencies are also possible.

The same principle can be applied to the mobile saddle points sequence as well. Corrective spatially dependent phase shifts can be applied during the refocusing period in order to improve the effective matching on both sides of the saddle point.

EXAMPLE 6

Alternatively, pulse schemes based on variable rotation composite pulses can be used to perform z-rotations that are proportional to the rf-inhomogeneities. Radio-frequency inhomogeneity may be exploited through a pulse scheme to provide a less demanding duty cycle than with constant rotation π/2 composite pulses.

In order to obtain a high resolution NMR spectrum, it is necessary to refocus the effect of different Larmor frequencies in such a way that equivalent spins give rise to narrow signals while chemical shifts are maintained. One way to achieve this is through the use of composite radio-frequency pulses that have the net effect of a negative sign rotation of the magnetization around the z-axis of the rotating reading frame, which compensates for the development of the magnetization under the influence of the inhomogeneous magnetic field. The rotation of in-plane magnetization about an angle β around the z-axis can be achieved with the following composite pulse:

$$P_z(\beta) = P_y(\pi/2) R_x(\beta) P_{-y}(\pi/2)$$

where $R_a$ (β) and $P_a$ (β) respectively represent an ordinary square pulse and a composite pulse around the a axis of the flip angle β. In the case of inhomogeneous fields, the $P_y(\pi/2)$ and $P_{-y}(\pi/2)$ pulses are constant rotation composite π/2 pulses which ideally compensate for the rf and static magnetic field inhomogeneities, while $R_x$ (β) ideally depends only upon $B_1$ (r).

Inversion pulses induce inversion of the z magnetization over a wide range of rf and/or offset imperfections. An effective inversion pulse can be visualized as a series of π rotations occurring around a wide distribution of axes on the xy plane. When the direction of these axes depends on the rf, a spatially variable phase shift can be attained if a first π pulse is linked with a second inversion pulse displaying a new set of axes. For example, one can combine two 180° pulses to form a 360° composite pulse that introduces a net z phase shift.

In addition, if the rf variation is small enough, the pulse behaves as a π rotation about an axis shifted from the nominal axis by an amount proportional to the rf variation. The sign of the phase shift depends on the relative phases within the composite π pulse. Accordingly, it can be seen that a variable phase shift on spins subjected to an inhomogeneous rf field can be created from the following pulse:

$$P_z = R_{-z}(4\epsilon) + O(\epsilon^2)$$

where ε is a given deviation from the nominal angle.

It can be seen that a whole set of compensated pulses having different features can be devised with a z-rotation pulse comprising a combination of variable rotation inversion pulses. For example, it has been observed that the rotation of $R(\pi/2)_x - R(\gamma)_y - R(\pi/2)_x$ can be made offset insensitive if γ is close to 3π/2. This provides the following z-rotation pulse sequence:

$$P_z = R_x(\pi/2) R_y(3\pi/2) R_x(\pi) R_{-y}(3\pi/2) R_x(\pi/2)$$

Because there is no other compensation for β other than increasing rf amplitude, an alternative z-rotation pulse sequence would have the form as follows:

$$P_z = R_x(\pi) R_y(\pi) R_x(2\pi) R_{-y}(\pi) R_x(\pi)$$

Figures 10A, 10B, 10C:
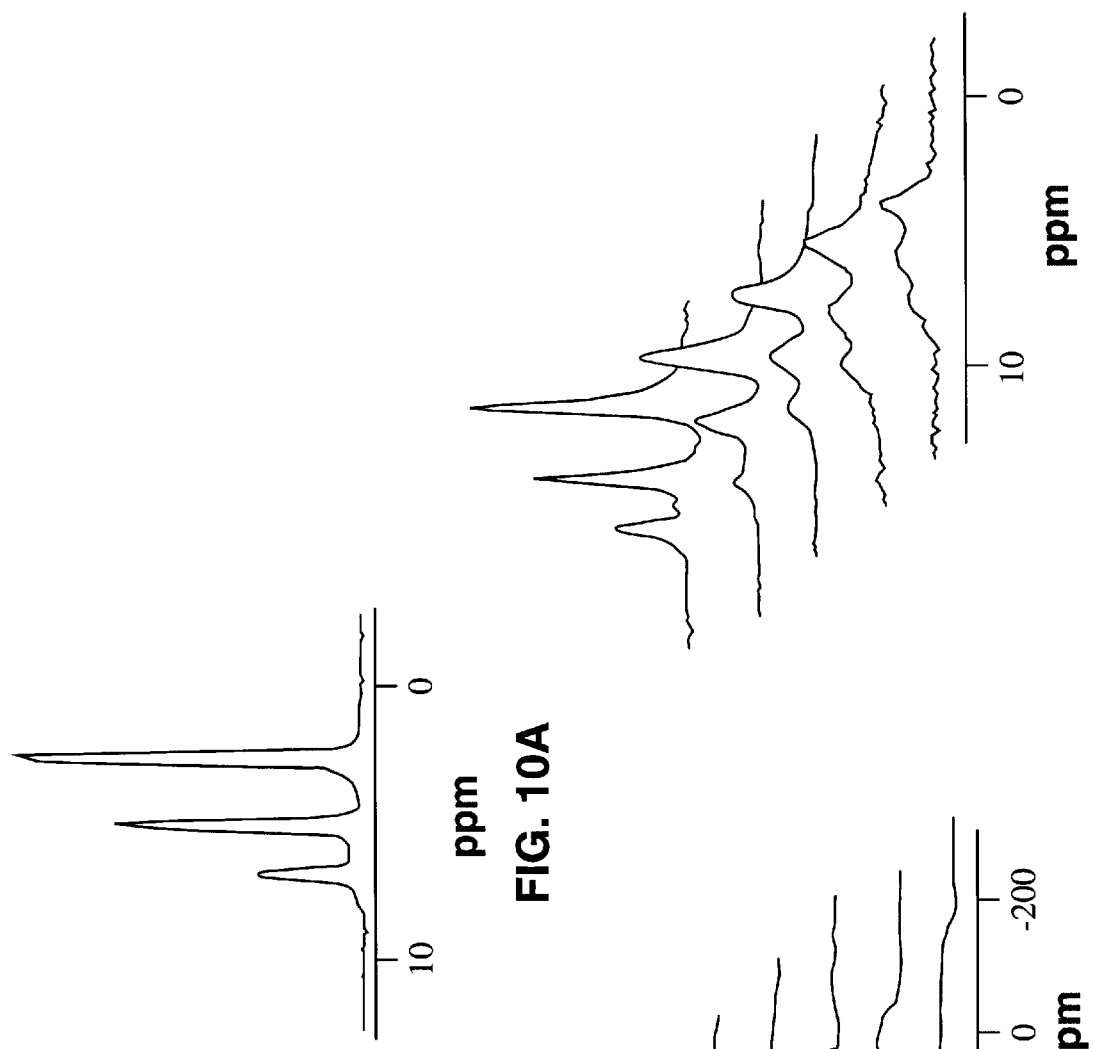
FIG. 10A is a graph of a standard one-pulse NMR spectrum of pure ethanol is shown as a reference.
FIG. 10B is a graph of a standard one-pulse spectrum in the presence of a linear $B_0$ gradient showing the line broadening caused by the intrinsic inhomogeneity of the external magnetic field.
FIG. 10C is a graph of the spectra of FIG. 10B after the sample was exposed to a pulse train to detect the chemical shift.

Turning now to FIG. 10A, a standard one-pulse NMR spectrum of pure ethanol is shown as a reference. This experiment was conducted in a super-widebore imaging magnet and NMR spectrometer operating at a proton frequency of 179.12 MHz and an imaging probe head with three perpendicular gradient coils. A variable gradient of $dB_0/dx$ of 6.5 to 50 kHz/cm along the x-axis was applied.

In FIG. 10B, the standard one-pulse spectra in the presence of a linear $B_0$ gradient showing the line broadening caused by the intrinsic inhomogeneity of the external magnetic field. It can be seen that the spread in Larmor frequency ranges from 40 to 350 ppm obscuring the chemical shift.

The sample was exposed to a pulse train to detect the chemical shift as seen in FIG. 10C. After an initial π/2 pulse, a variable phase shift was created through a pulse series composed of an integral number of z rotation $P_z$ pulses. The dwell time was set to that a nutation echo is formed at the end of the period. The amplitude of the echo was modulated with the chemical shift. It can be seen that the stroboscopic detection of the refocused echo points gives an inhomogeneity free FID.

Figure 10E:
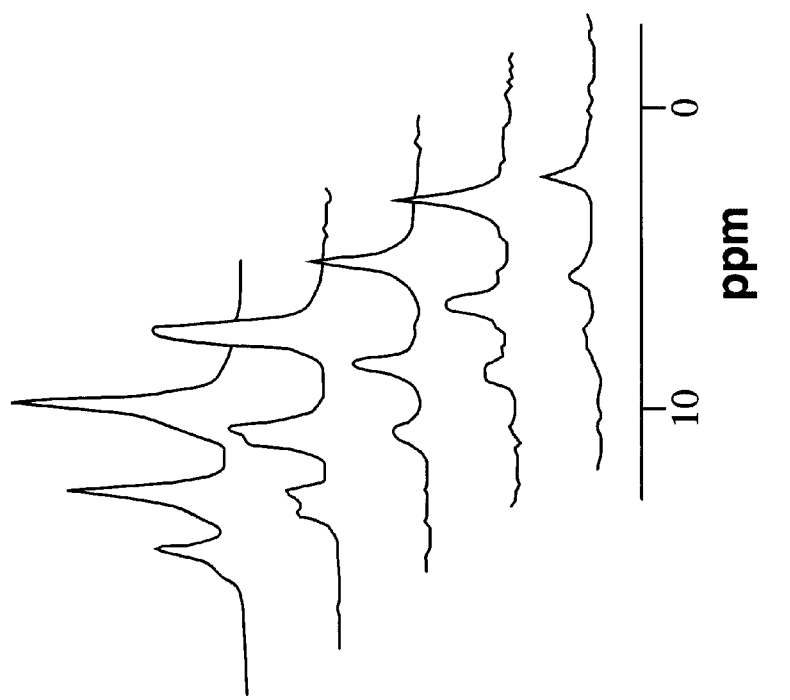
FIG. 10E is a graph of the spectra of the calculated response when a refocusing pulse train is applied according to the present invention.
Figure 10D:
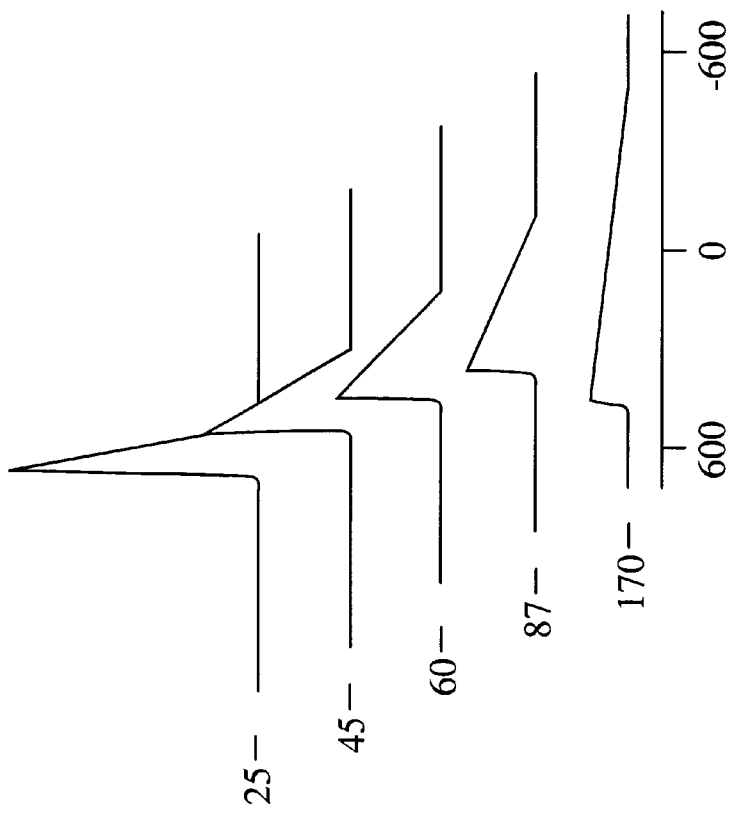
FIG. 10D shows a progressively higher field gradient pointing along the chain.

Referring now to FIG. 10D and FIG. 10E, numerical simulations were performed using stronger rf amplitudes and field gradients than produced the data presented in FIG. 10B and FIG. 10C. An ensemble of 200 "molecules" (1200 spins ½) were placed in a one dimensional arrangement under constant linear $B_0$ and rf gradients. The latter was set so that the last molecule in the chain experiences no rf gradient at all.

The spectrum is has three lines spread over 6 ppm and has a linewidth of 0.3 ppm, introduced by a phenomenological $T_2$ (5 ms) damping in the FID. The progressively higher field gradient pointing along the chain is shown in FIG. 10D. The calculated response when the refocusing pulse train is applied is shown in FIG. 10E. The nominal rf amplitude of 83 kHz was used for spins located closest to the coil. It can be seen that the chemical shift information is left unaltered in the presence of very high gradients in the order of 170 kHz/cm.

EXAMPLE 7

An alternative pulse scheme according to the present invention is based on the use of multiple adiabatic passages that manipulate the pulse of the excitation over a large bandwidth of radio frequencies and amplitudes. One pulse, for example, is an adiabatic double passage pulse where the second passage is performed using an amplitude that is one half of the amplitude of the first passage. In this embodiment, an essentially linear phase roll is observed that is proportional to the rf amplitude at each point of the sample. The resulting excitation profile is independent of the frequency of the excited spin, providing that the adiabatic condition is fulfilled throughout each pulse.

It can be seen that more general phase shaping may be achieved by modifying the characteristics of the rf pulse. For example, an adiabatic double passage, sweeping through asymmetric limits, produces a non-linear phase encoding that is dependent on the rf amplitude and the frequency of each spin. Thus the excitation profile can be adapted to any physical setting through the control over these parameters. Multiple adiabatic pulses may be used in ex-situ NMR, Magnetic Resonance Imaging, Optical Spectroscopy, Quantum Computing and similar applications. Although radio frequency pulses have been described as an example, it will be understood that the procedure can be utilized with magnetic field (dc) pulses as well.

Turning now to FIG. 11A through FIG. 11D, the results of tests using two full passage adiabatic pulses is shown. The embodiment shown is particularly suited for use with wide open scanners or, alternatively, one-sided magnets able to provide spectroscopic information would be extremely useful in areas ranging from health, food technology, geology and other industrial applications.

One difficulty experienced with one-sided magnets and trains of composite pulses is that the magnitude of the field gradient often imposes a field variation along the sample tens of times larger than the nominal amplitude of the rf. The large offset implies that only a small fraction of the sample can be properly encoded, mainly the part of the sample close to resonance. As a result, a rapid shrinking of the echo amplitude may make detection very difficult in practice. However, this effect may be dramatically reduced by the use of a double passage of adiabatic pulses sweeping along the frequency range of interest.

The experimental performance of the scheme was tested by the use of an array that emulates, in a controlled fashion, the spatial dependence of the rf and static fields acting on a sample that faces a one-sided magnet. Immersed in the bore of a 4T-superconducting magnet, a thin glass cylinder filled with a mixture of acetone and benzene was irradiated by means of a conical coil. This creates an rf field that linearly decays along the sample. At the same time, a static field gradient along the coil axis was provided during the pulse sequence by means of an imaging setup.

Figure 11A:
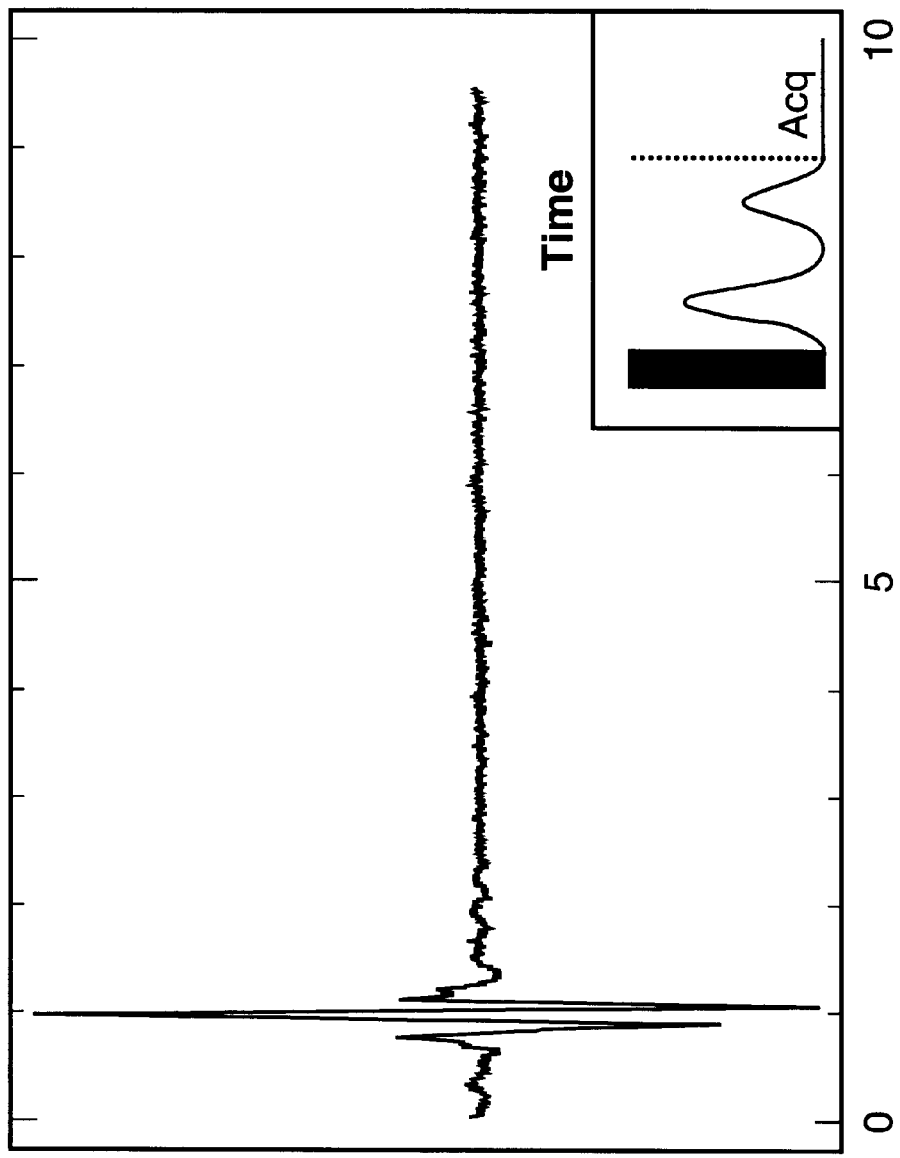
FIG. 11A is a spectrum of a nutation echo from an acetone/benzene mixture induced after a single pulse excitation.

FIG. 11A shows the FID of an acetone/benzene mixture recorded in the presence of a 20 kHz/cm field gradient. A single hard 90° pulse (10 μs hard π/2, 20 kHz maximum rf) was used to provide initial excitation, and a weak but long adiabatic double passage was applied immediately after to encode the phase of the sample magnetization. Each full passage was a 20 ms hyperbolic secant pulse and the amplitude ratio between the first and the second passage was 0.5. The peak rf power was 3 kHz whereas the static field gradient (present during and after the pulses) was 20 kHz/cm.

The combined presence of matched rf and static field gradients results in a sharp nutation echo taking place at 1 ms. The echo position can be controlled by the relative amplitude of each adiabatic full passage.

Figure 11B:
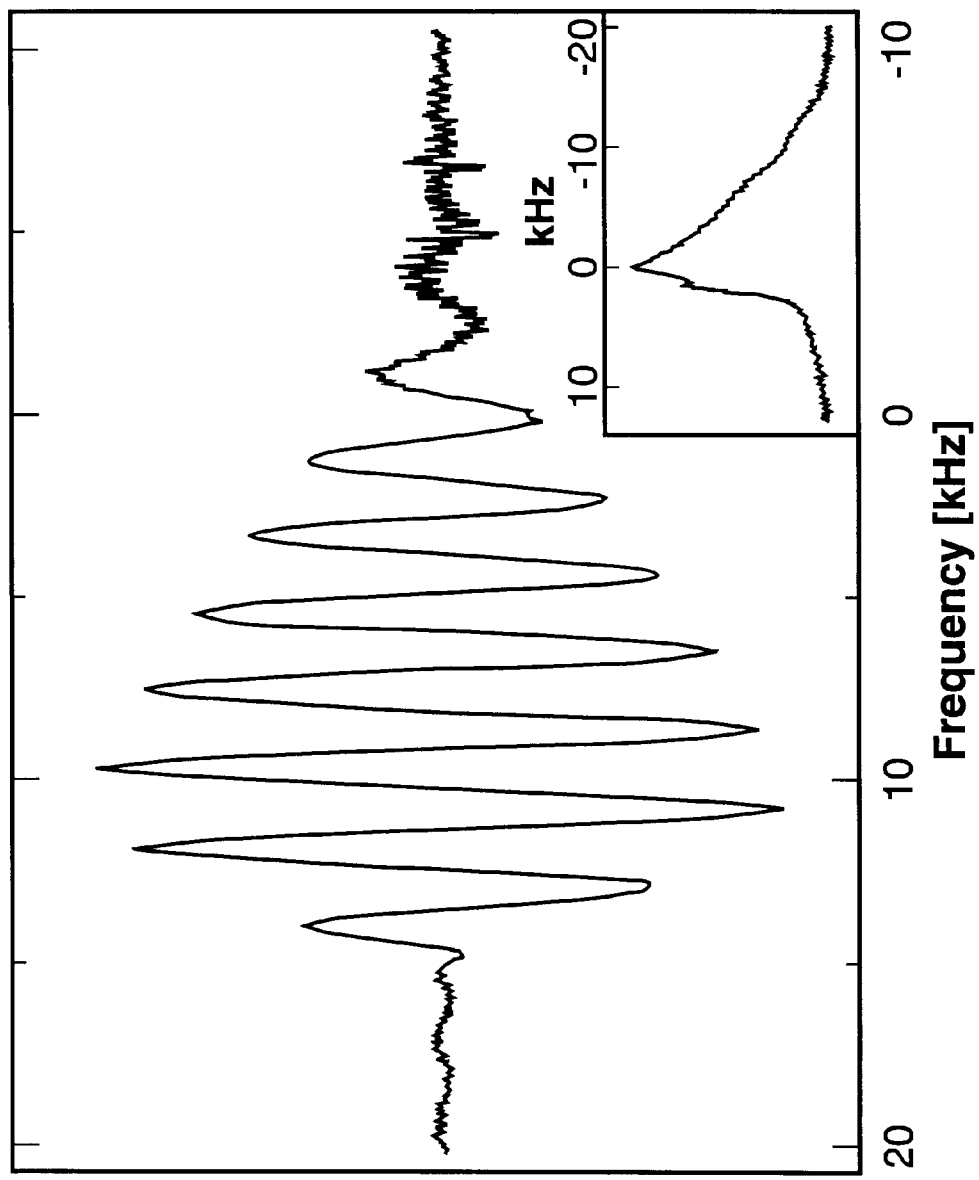
FIG. 11B is a Fourier transformation of FIG. 11A showing an rf dependent phase shift.

Turning now to FIG. 11B, a Fourier transformation of the FID of FIG. 11A providing an rf-weighted image of the encoded phase is shown. The adiabatic double passage encodes an rf dependent phase shift. As the offset frequency goes from positive to negative values, the rf amplitude diminishes accordingly. This, in turn, translates into a change of the local phase of the magnetization and a corresponding modulation of the spectrum. For very low rf amplitudes, the adiabatic condition is not fulfilled anymore leading to an uncontrolled behavior. However, because the signal contribution is also very low from these points, the latter does not represent a serious distortion of the echo.

For comparison, a non-modulated image obtained after a single pulse excitation has been added as an insert in FIG. 11B. A good correspondence between this last spectrum and the envelope of the modulated image is observed.

In the embodiment shown, two full-passage adiabatic pulses are applied immediately one after the other. Both pulses are identical with the exception of the peak amplitude whose relative variation determines the degree (and sense) of the modulation. It can be seen that the first passage induces a modulation of the transverse magnetization that strongly depends on the local value of the rf field and, to a lesser extent, on the offset relative to the central frequency. In the double rotating frame, the beginning of the second passage is seen as an inversion of the effective field that reverses the sense of the modulation. However, because the rf amplitude is different, the accumulated phase during the first passage is not completely canceled during the second one. The difference is roughly proportional to the local rf field value resulting in a modulation that reproduces its spatial variation. The offset dependence, already weak, is canceled out since the frequency sweep during the second passage is identical to the first one.

Figure 11C:
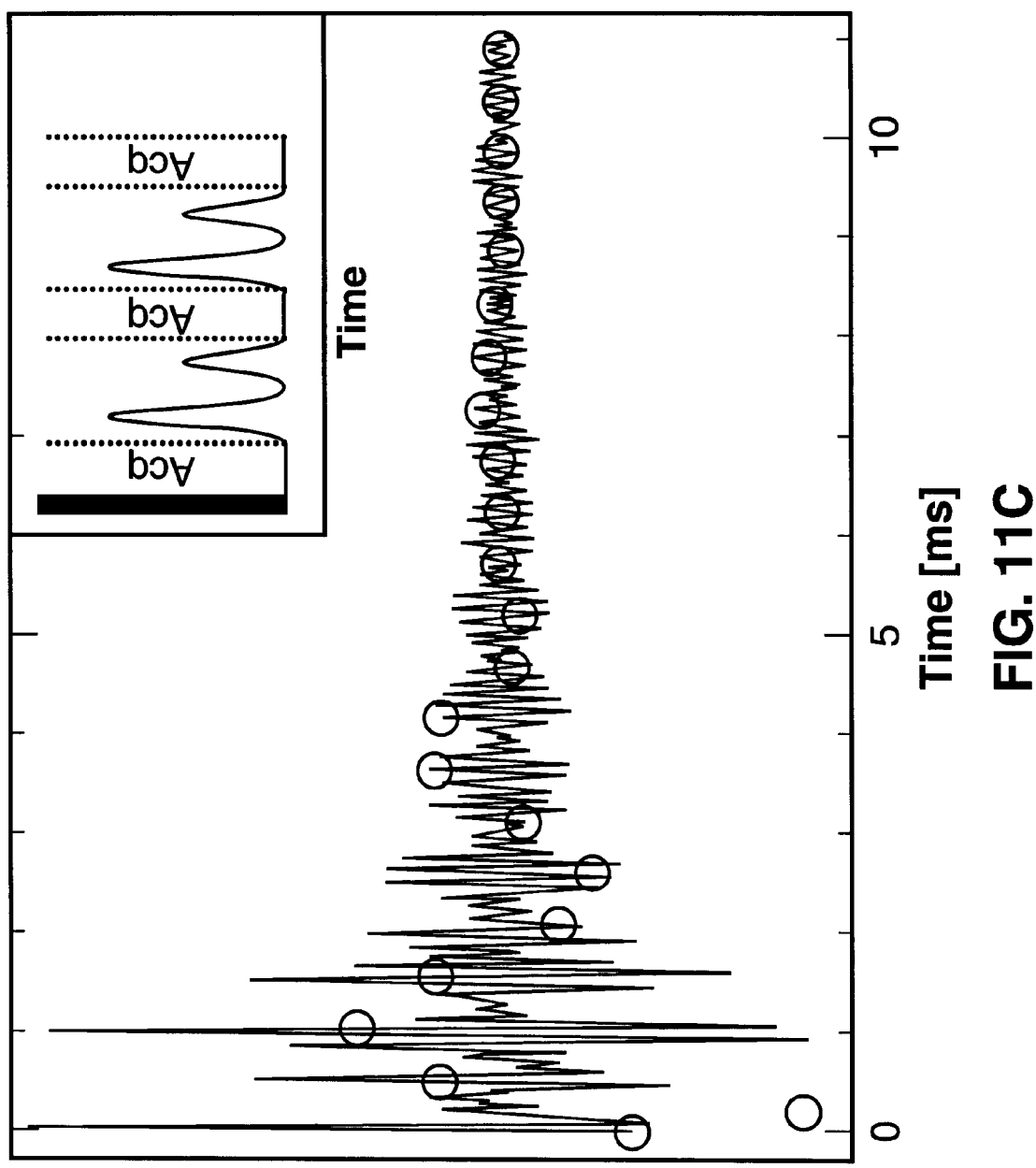
FIG. 11C shows a free induction signal immediately after an excitation pulse and subsequent free evolution periods after each double passage of the pulse train. Echo centers are shown as open circles.

Turning now to FIG. 11C, the same procedure can be repeated to create a train of adiabatic refocusing pulses. The evolution of the magnetization in the inter-pulse intervals along the train is shown. The free induction signal immediately after the excitation pulse and in subsequent free evolution periods after each double passage of the pulse train can be seen. The field gradient used was 20 kHz/cm and the pulses where 10 ms hyperbolic secant type pulses. The amplitude ratio (0.7:1) was adjusted so that the echoes took place in the middle of the free evolution interval.

Figure 11D:
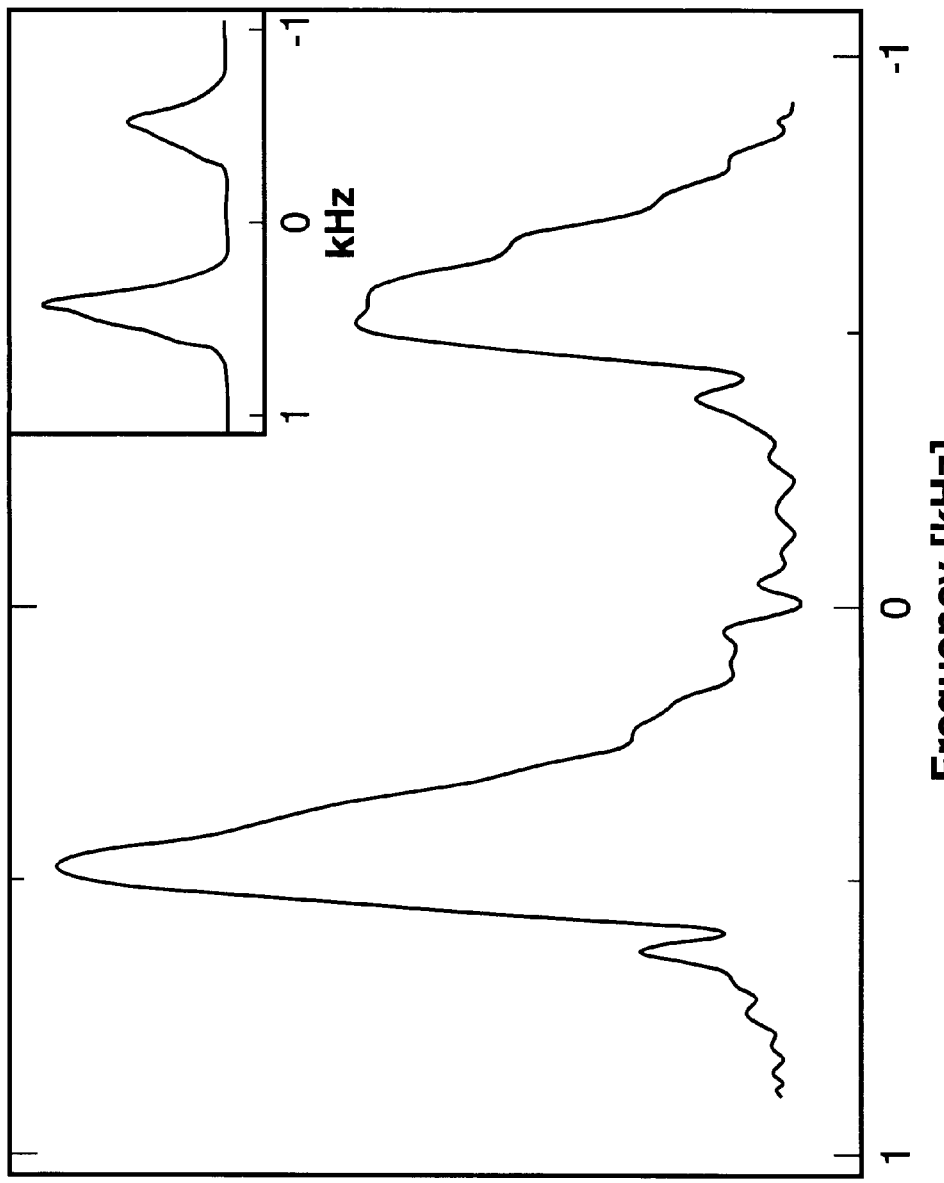
FIG. 11D is a Fourier transformation of the signal shown in FIG. 11C.

Referring now to FIG. 11D, if the acquisition is restricted to the centers of each echo (open circles), the resulting FID is inhomogeneity-free and contains the full spectral information. It can be seen that the amplitude of the first echoes is comparable to the signal immediately following the excitation pulse indicating that almost the whole sample constructively contributes to the echo. Comparatively, this represents a considerable improvement with respect to the performance of composite z-pulses where, mainly due to limitations created by the offset, only a small fraction of the sample can be successfully refocused. For example, FIG. 11B shows that the inhomogeneous broadening along the sample reaches 20 kHz. This value is considerably higher than the 3 kHz available during the peak of the adiabatic pulse in the region of maximum rf. The gradual decay of the amplitude in subsequent echoes mainly derives from the repeated accumulation of errors in the refocusing. This is caused by an imperfect correspondence between the modulation induced by the pulses and that induced by the field gradient.

After a Fourier transformation, the resulting spectrum is free of inhomogeneities and compares well with the unperturbed spectrum recorded in the absence of field gradients.

Alternatively, a series of spectra of decreasing resolution can be obtained with the same sequence if the amplitude of the second passage is altered beyond the minimum required in FIG. 11C. In this case, the echo takes place earlier and the stroboscopic acquisition in the center of the free evolution interval should provide free induction decays in the presence of effective gradients controlled by rf. Variable gradient imaging along the axis of dominant inhomogeneity arises as an interesting possibility, specially for one-sided scanners where the field decay is usually not a parameter under control.

Because the technique assumes that the static and rf fields correlate, the sample spins can be imagined as forming a curve with positive slope. If the modulation created by the pulse is strictly proportional to the local rf, only a fraction of the sample is refocused when this curve is not a straight line. However, the spin response to the rf amplitude can itself be modified to encode a phase modulation proportional to the static field at each point. In the present case, the modulation can be altered if, besides the amplitude, other parameters like the central frequency or the bandwidth of the sweep are modified during the second passage.

Further calculations have shown that the offset dependence is smoothly reintroduced in the selected frequency interval. When projected onto an rf/static field correlation curve, this dependence now leads to an altered response of the local magnetization to the rf inhomogeneity. This kind of "active" field matching could enable the generalization of this technique to arbitrary rf profiles.

EXAMPLE 8

Imperfect static field homogeneities have been known to occur inside the bore of a superconducting magnet in the typical in-situ apparatus. It is often observed that the there is a "sweet spot" in the middle of many gradient coil designs that provides the most uniform magnetic gradient. The strength of the gradient may vary substantially away from the center of the coil so the sample may experience a stronger gradient near the center and a weaker gradient further from the center of the coil. Consequently, once the magnet is properly shimmed using superconducting or room temperature shims, there is often a residual line-width in the observed NMR lines that is produced by imperfect static field homogeneities. These signals are generated from sections of the sample that are outside the uniform magnetic field gradient. Compensating for the static inhomogeneities with matched radio frequency inhomogeneities, as described in the ex-situ methodology, can reduce the residual line-width and provide ultra high-resolution NMR spectra. This procedure can also be applied to very strong hybrid magnets lacking static magnetic field homogeneity and imaging scanners.

Accordingly, the ex-situ methodology can be applied in typical NMR cases where the sample resides within the bore of a superconducting magnet experiencing imperfect static field homogeneities in order to obtain high resolution NMR spectra and images.

EXAMPLE 9

Spinning a sample at high speeds at a well defined angle (magic angle) to the main magnetic field has proven to be a powerful tool in the study of heterogeneous samples such as powdered solids and heterogeneous solid-liquid mixtures. Magic angle spinning (MAS) was developed to minimize the spectral line broadening that is observed from intermolecular and intra-molecular dipole couplings, quadrupolar couplings, chemical shift anisotropy, sample inhomogeneity and magnetic susceptibility. However, in many settings it is not possible to spin a sample at high speeds within a homogeneous magnetic field. In these situations, the sample must remain stationary while the magnetic field is rotated in order to perform nuclear magnetic imaging. This embodiment may be used in traditional in-situ experiments as well as with ex-situ applications. The magnetic field may be rotated either through the mechanical rotation of electromagnets or permanent magnets or by cycling currents in a configuration of fixed electromagnets.

For example, a sample could be placed in the center of three perpendicular pairs of regular or superconducting coils. To perform magic angle spinning, one pair of coils would have a constant current applied while the current in the two other pairs would be oscillating. It can be seen that other current modulations are possible that can give the same effect with a higher degree of imperfection compensation.

It can be seen that such a probe head can be utilized to perform magic angle spinning on samples lying physically outside of the center of the coils and resolve the data through the use of trains of pulses. The geometry would preferably correspond to the inhomogeneous static magnetic field head described in FIG. 6 with the additional feature of rotating magnetic fields.

It can also be seen that the combination of rotating magnetic fields and physical sample spinning provides an alternative Double Rotation technique where the sample is spun simultaneously about two different axes in order to narrow second order quadrupolar broadening for example. This alternative method of Double Rotation could be accomplished with much higher frequencies than presently achievable. Rotating magnetic fields will also allow other complex procedures to be performed such as Dynamic Angle Spinning, Cross Polarization and Decoupling.

It can further be seen that such a probe head would produce a time dependent magnetic field rotating at a virtually and variable angle including the magic angle. A series of spectra would be obtained from the magnetic field rotating at different angles and used to reconstruct the isotropic and subsequently the anisotropic spectral information from the sample. This may be particularly useful in ex-situ settings where the access to the object might be limited by spatial constraints.

Accordingly, it can be seen that the field variation concept may be applied to the use of permanent magnets or electromagnets to generate a magnetic field spinning at the magic angle with respect to static in-situ or ex-situ samples. The combination of spinning with high resolution in the inhomogeneous fields serves to overcome spectral broadening due to orientational anisotropy, and could be extended to the enhanced ex-situ NMR of hyperpolarized gases. Mechanical problems related to complex rotations of the sample could be obviated, opening the way to high resolution ex-situ NMR of solids and other systems in which in-situ magic-angle spinning is known to be of benefit. Such systems include fluids contained within the pores of solid materials or inside organisms, where resolution is often compromised by orientation-dependent magnetic susceptibility.

With an apparatus described above a time dependent magnetic field can be rotated at variable angles in both in-situ and ex-situ applications. The spectra and images provided would contain chemical shift information that is free of field inhomogeneities and anisotropies using the methods described herein.

In one embodiment of the invention, it is not necessary to rotate the magnetic field at the magic angle in order to obtain isotropic NMR data. A series of spectra obtained from rotation of the magnetic field at different angles can be used to reconstruct isotropic and subsequently anisotropic data from a sample. Limited angle spinning away from the magic angle may be accomplished through several methods with Switched Angle Spinning (SAS) with a direct 2D transform being preferred.

The small angle SAS example assumes that there are two angles. The first angle, $\theta_1$, is spinning along the magnetic field and a second angle, $\theta_2$, spinning close to the magic angle.

In the case of two interactions one isotropic (I) and one anisotropic (A) and the can be scaled by (n) at $\theta_2$, then I+A at $\theta_1$ at time ($t_1$) and (I+nA) at $\theta_2$ at time ($t_2$). It can be seen that a simple rotation or shear of variables projects (I) on to the omega 1' axis with a scaling factor that depends on (1−n). Thus, the original SAS 2D spectrum contains two broad projections consisting of oriented correlated streaks with a width that is dictated by isotropic broadening. It is preferred that the scaling factor (1−n) be such that the sheared projected spectral resolution is dominated by the real isotropic line-widths so that the oriented streaks are resolved from each other.

It can be seen that the same results can be achieved in one dimension through the use of a train of pi pulses synchronized with the switching of the angle with the acquisition points at the echoes to recover the isotropic information.

Alternatively, Variable Angle Correlation Spectroscopy (VACSY) with data filling may be used. VACSY is a two dimensional NMR technique that provides spectra with isotropic chemical shifts resolved in one dimension and corresponding shielding anisotropies resolved in a second dimension.

Thus, the invention provides an apparatus and method for obtaining chemical shift information from a sample outside the bore of a magnet in an inhomogeneous static field and pulse field. Subjects that could not be placed previously in a large super-conducting magnet may now be accessible with the present invention.

Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method for providing high resolution ex-situ NMR spectroscopy, comprising:
   subjecting a sample to an inhomogeneous static magnetic field;
   matching the static field and radio frequency gradients in regions of the sample;
   sequentially exposing the sample to composite z-rotation pulses; and
   acquiring nuclear magnetic resonance data.

2. A method as recited in claim 1, wherein said step of sequentially exposing the sample to composite z-rotation pulses comprises exposing said sample to a train of composite z-rotation pulse sequences over time.

3. A method as recited in claim 2, said method further comprising:
   performing a phase shift alteration to compensate for undesired evolution during radio frequency irradiation after each pulse sequence.

4. A method as recited in claim 2, wherein the train of composite z-rotation pulses comprises the repeated pulse sequence comprising:
   a dephasing $\beta$ pulse for a first duration;
   a constant rotation $\pi/2$ pulse for a second duration;
   a period of free precession for a third duration;
   a data point acquisition; and
   a second constant rotation $\pi/2$ pulse for a fourth duration.

5. A method as recited in claim 4, wherein said $\beta$ pulses are correlated with the nutation amplitude.

6. A method as recited in claim 2, wherein the train of composite z-rotation pulses comprises the repeated pulse series comprising:
   a first $\beta$ pulse for a first duration;
   a first constant rotation $\pi/2$ pulse for a second duration;
   a period of free precession for a third duration;
   a first data point acquisition;
   a second constant rotation $\pi/2$ pulse for a fourth duration;
   a second $\beta$ pulse for a fifth duration;
   a third constant rotation $\pi/2$ pulse for a sixth duration;
   a period of free precession for a seventh duration; and
   a second data point acquisition.

7. A method as recited in claim 2, wherein each said composite z-rotation pulse comprises the pulse sequence $(\pi/2)_{-y}(\beta(\vec{r}))_x(\pi/2)_y$ repeated stroboscopically.

8. A method as recited in claim 2, wherein each said composite z-rotation pulse comprises the pulse sequence of the pulse $(\pi/2)_{-y}(\beta(\vec{r}))_x(\pi/2)_y$ alternating with the pulse $(\pi/2)_y(\beta(\vec{r}))_{-x}(\pi/2)_{-y}$ repeated stroboscopically.

9. A method as recited in claim 1, wherein each said composite z-rotation pulse comprises the pulse $(\pi/2)_{-y}(\beta(\vec{r}))_x(\pi/2)_y$.

10. A method as recited in claim 1, further comprising:
    spinning said sample at the angle of approximately 54.7 degrees from said inhomogeneous magnetic field.

11. A method as recited in claim 1, further comprising:
    rotating said inhomdgeneous magnetic field.

12. A method as recited in claim 11, wherein pulse sequences are synchronized with said rotations of said inhomogeneous magnetic field.

13. A method for two dimensional homonuclear correlation spectroscopy of a sample in an inhomogeneous static magnetic field, comprising:

applying a sequence of pulses to a sample, said pulse sequence having at least one desensitization pulse, a plurality of excitation pulses and a plurality of z-rotation pulses;

acquiring nuclear magnetic resonance data; and resolving and recording the data.

14. A method as recited in claim 13, further comprising:

repeating the application of said pulse sequence stroboscopically; and acquiring free induction decay data during the application of each sequence;

resolving and recording the acquired data.

15. A method as recited in claim 14, wherein said pulse sequence repeated stroboscopically comprises:

a $(\alpha(\vec{r}))_x$ followed immediately by a first $(\pi/2)_y$ pulse;

a first time period;

a second $(\pi/2)_y$ pulse;

a second time period;

a composite $(\pi/2)_y(\beta(\vec{r}))_{-x}(\pi/2)_{-y}$ pulse;

a third time period of duration to allow a data point acquisition;

a composite $(\pi/2)_{-y}(\beta(\vec{r}))_x(\pi/2)_y$ pulse;

a fourth time period of duration to allow a data point acquisition; and a third $(\pi/2)_y$ pulse.

16. A method as recited in claim 13, wherein said pulse sequence comprises:

a desensitization pulse;

a first excitation pulse configured to create a nutation echo;

a second excitation pulse applied at approximately the same time as the occurrence of said nutation echo; and a plurality of composite z-rotation pulses.

17. A method as recited in claim 16, wherein said plurality of composite z-rotation pulses comprises:

a composite $(\pi/2)_y(\beta(\vec{r}))_{-x}(\pi/2)_{-y}$ pulse;

a period of free evolution; and a composite $(\pi/2)_{-y}(\beta(\vec{r}))_x(\pi/2)_y$ pulse.

18. A method as recited in claim 16, wherein said desensitization pulse comprises an $(\alpha(\vec{r}))_x$ pulse.

19. A method as recited in claim 16, wherein said first excitation pulse and said second excitation pulse comprise a $(\pi/2)_y$ pulse.

20. A method as recited in claim 13, wherein said pulse sequence comprises:

a $(\alpha(\vec{r}))_x$ pulse followed immediately by a first $(\pi/2)_y$ pulse;

a first time period;

a second $(\pi/2)_y$ pulse;

a second time period;

a composite $(\pi/2)_y(\beta(\vec{r}))_{-x}(\pi/2)_{-y}$ pulse;

a third time period of duration to allow a data point acquisition;

a composite $(\pi/2)_{-y}(\beta(\vec{r}))_x(\pi/2)_y$ pulse;

a fourth period of duration to allow a data point acquisition; and a third $(\pi/2)_y$ pulse.

21. A method as recited in claim 20, wherein said first time period is of a duration such that the second excitation pulse is applied at approximately the same time as the occurrence of a nutation echo from the first pulses.

22. A method as recited in claim 20, wherein the duration of said desensitization pulse is configured to be approximately proportional to said first time period.

23. A method as recited in claim 20, wherein said second time period is approximately $\tau_{dw}/2$.

24. A method as recited in claim 20, wherein said third and said fourth time periods are approximately $\tau_{dw}$.

25. A method for heteronuclear correlation NMR spectroscopy of a sample in an inhomogeneous static magnetic field, comprising:

applying a sequence of pulses to a sample, said pulse sequence having at least one desensitization pulse, a plurality of excitation pulses and a plurality of z-rotation pulses;

acquiring nuclear magnetic resonance data; and resolving and recording the data.

26. A method for providing high resolution ex-situ NMR spectroscopy, comprising:

subjecting a sample to an inhomogeneous static magnetic field;

matching static field and radio frequency gradients in regions of the sample;

sequentially exposing the sample to composite z-rotation variable inversion pulses; and obtaining chemical shift data from NMR signals.

27. A method as recited in claim 26, wherein said z-rotation pulses comprise the pulse $P_z=R_x(\pi/2)R_y(3\pi/2)R_x(\pi)R_{-y}(3\pi/2)R_x(\pi/2)$.

28. A method as recited in claim 26, wherein said z-rotation pulses comprise the pulse $P_z=R_x(\pi)R_y(\pi)R_x(2\pi)R_{-y}(\pi)R_x(\pi)$.

29. A method as recited in claim 26, further comprising:

spinning said sample at the angle of approximately 54.7 degrees from said inhomogeneous magnetic field.

30. A method as recited in claim 26, further comprising:

rotating said inhomogeneous magnetic field.

31. A method as recited in claim 26, wherein said pulse sequences are synchronized with said rotations of said inhomogeneous magnetic field.

32. A method for providing high resolution ex-situ NMR spectroscopy, comprising:

subjecting a sample to an inhomogeneous static magnetic field;

matching the static field and radio frequency gradients in regions of the sample;

exposing said sample to at least one excitation pulse;

sequentially exposing said sample to a plurality of full passage adiabatic pulses each providing a nutation echo; and acquiring nuclear magnetic resonance data.

33. A method as recited in claim 32, wherein said nuclear magnetic resonance data is acquired at a center of each nutation echo.

34. A method as recited in claim 32, wherein said nuclear magnetic resonance data is acquired after the sample is exposed to two adiabatic pulses in succession.

35. A method as recited in claim 32, wherein said sequence of full passage adiabatic pulses comprises:

a first adiabatic pulse;

a period of time; and a second adiabatic pulse.

36. A method as recited in claim 35, said first and second adiabatic pulses having a radio frequency amplitude, wherein the radio frequency amplitude of said first adiabatic pulse is approximately twice the radio frequency amplitude of said second adiabatic pulse.

37. A method as recited in claim 32, further comprising:

shaping the phase by manipulating the physical characteristics of said plurality of adiabatic pulses.

38. A method as recited in claim 32, further comprising:

shaping said at least one excitation pulse by manipulating at least one physical characteristic of said excitation pulse.

39. A method as recited in claim 38, wherein said manipulation of said physical characteristics comprises:

varying the amplitude and phase of said excitation pulse over time.

40. A method for reducing residual line width due to static field inhomogeneities during high resolution in-situ NMR spectroscopy, comprising:

shimming a superconducting NMR magnet having a sample within the bore of said magnet;

matching static field and radio frequency gradients in the sample;

sequentially exposing the sample to composite z-rotation pulses; and acquiring nuclear magnetic resonance data wherein said residual line width due to static field inhomogeneities is reduced.

41. An apparatus for conducting ex-situ nuclear magnetic resonance spectroscopy, comprising:

a switchable coil;

an antenna;

a plurality of magnets configured to create a magnetic field gradient with a saddle point; and means for recording NMR spectral information.

42. An apparatus as recited in claim 41, wherein said saddle point is variable.

43. An apparatus as recited in claim 41, said apparatus further comprising:

means for exposing a sample at said saddle point to a sequence of z-rotation pulses.

44. An apparatus as recited in claim 43, wherein said means for exposing a sample at a saddle point to a sequence of z-rotation pulses comprises a plurality of rf coils.

* * * * *